(12) United States Patent
Tanimoto et al.

(10) Patent No.: US 7,880,143 B2
(45) Date of Patent: Feb. 1, 2011

(54) ELECTRON BEAM APPARATUS

(75) Inventors: Sayaka Tanimoto, Kodaira (JP); Hiroya Ohta, Kokubunji (JP); Hiroshi Makino, Kokubunji (JP); Ryuichi Funatsu, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 618 days.

(21) Appl. No.: 11/958,717

(22) Filed: Dec. 18, 2007

(65) Prior Publication Data

US 2010/0133433 A1 Jun. 3, 2010

(30) Foreign Application Priority Data

Dec. 27, 2006 (JP) .............................. 2006-350839

(51) Int. Cl.
*H01J 37/26* (2006.01)
(52) U.S. Cl. .................. 250/310; 250/306; 250/307; 250/396 R; 250/397; 250/492.3
(58) Field of Classification Search ................ 250/306, 250/307, 309, 310, 311, 396 R, 397, 491.1, 250/492.1, 492.2, 492.3; 430/296
See application file for complete search history.

(56) References Cited

U.S. PATENT DOCUMENTS

| | | | |
|---|---|---|---|
| 5,892,224 A * | 4/1999 | Nakasuji ..................... 250/310 |
| 6,066,849 A | 5/2000 | Masnaghetti et al. |
| 6,172,363 B1 | 1/2001 | Shinada et al. |
| 6,914,441 B2 | 7/2005 | Talbot et al. |
| 2005/0279936 A1* | 12/2005 | Litman et al. ............... 250/310 |
| 2007/0194229 A1* | 8/2007 | Okuda et al. ................ 250/310 |
| 2010/0181479 A1* | 7/2010 | Knippelmeyer et al. ..... 250/310 |

FOREIGN PATENT DOCUMENTS

JP 10-339711 * 12/1998

* cited by examiner

*Primary Examiner*—Jack I Berman
*Assistant Examiner*—Nicole Ippolito Rausch
(74) *Attorney, Agent, or Firm*—Mattingly & Malur, P.C.

(57) ABSTRACT

A plurality of primary beams are formed from a single electron source, the surface charge of a sample is controlled by at least one primary beam, and at the same time, the inspection of the sample is conducted using a primary beam other than this. Also, for an exposure area of the primary beam for surface charge control and an exposure area of the primary beam for the inspection, the surface electric field strength is set individually. Also, the current of the primary beam for surface charge control and the interval between the primary beam for surface charge control and the primary beam for inspection are controlled.

17 Claims, 25 Drawing Sheets

ELECTRON BEAM APPARATUS

CLAIM OF PRIORITY

The present application claims priority from Japanese application JP 2006-350839 filed on Dec. 27, 2006, the content of which is hereby incorporated by reference into this application.

BACKGROUND OF THE INVENTION

The present invention relates to the electron beam technique, and in particular, to an electron beam apparatus such as an inspection apparatus, a microscope, etc. used in the semiconductor process, etc.

In the semiconductor process, a variety of kinds of electron beam apparatus are used with the aim of the observation of the circuit pattern formed on the wafer and the chip, the measurement, the defect review and classification, the inspection, etc. In these electron beam apparatus, the above-mentioned observation, measurement, defect review and classification, inspection, etc. are conducted by irradiating an electron beam called a primary beam on a sample and performing a variety of kinds of operation process for a signal obtained by detecting a secondary electron and a reflected electron, etc. which was generated.

In the above-mentioned apparatus with the aim of any one of the observation, the measurement, the defect review and classification, and the inspection, the improvement of the precision of the defect detection and the measurement is the important subject. As the detection precision of the secondary electron and the reflected electron is greatly affected by the surface charged state of the surface of the sample, in order to conduct the high precision inspection and measurement, the surface charge control of the surface of the sample is important.

For example, in JP-A-10-294345, it is disclosed an invention which controls the surface charged state of the sample by providing a preliminary electron source for irradiation other than an electron source for the primary electron beam and irradiating the electron beam irradiated from said preliminary electron source for irradiation on the sample. On the other hand, in JP-A-2002-524827, it is disclosed an invention which controls the surface charged state of the sample by scanning the primary electron beam on the sample. In the invention disclosed in said document, the surface charge control and the image acquisition by the same beam are made to be possible by shifting the irradiation of the electron beam for image-forming and the electron beam for surface charge control timewise. Also, in JP-A-10-339711, it is disclosed an electron beam apparatus which splits the electron beam into two using a biprism and irradiates one for surface charge control and the other for the inspection on the sample. As it irradiates the primary beam separately, the space between the irradiation position of the electron beam for inspection and the irradiation position of the electron beam for surface charge control can be made to be smaller than the preliminary irradiation method as disclosed in JP-A-10-294345, therefore it has an advantage that the time lag from the irradiation of the electron beam for surface charge control to the irradiation of the electron beam for image formation can be reduced.

On the other hand, in the electron beam apparatus, as well as the precision of the measurement and the inspection, it is also important to improve the execution rate of the above-mentioned observation, measurement, defect review and classification, inspection, etc., namely the throughput. The simplest method to improve the throughput is to make the area of the region from which the secondary electron/reflected electron is detected per unit time as large as possible while securing the detection amount of the secondary electron/reflected electron with which the signal amount necessary for the inspection and the measurement can be secured. For this reason, a variety of electron beam apparatus have been proposed such as a multicolumn method which detects the signal by scanning a plurality of electron beams simultaneously and in parallel on the sample using a plurality of electron beam columns, a collective irradiation image-forming method which obtains signals necessary for the detection and measurement by irradiating an area beam which has a certain wideness instead of a converged electron beam on the sample and collectively forming the image of the secondary charged particles which have been generated, etc. For example, in U.S. Pat. No. 6,914,441, an electron beam apparatus of multicolumn method is disclosed.

SUMMARY OF THE INVENTION

As described above, in the electron beam apparatus, the surface charge control of the sample is important. However, the technique described in JP-A-10-294345 has a difficulty in making the space between the irradiation position of the electron beam for inspection and the irradiation position of the electron beam for surface charge control small because of the problem of the size of the electron optical column and the preliminary electron source for irradiation. For this reason, there is a case where the surface charged state cannot be maintained because the time difference between the electron beam irradiation for surface charge control and the electron beam irradiation for signal acquisition cannot be made to be sufficiently short. The technique disclosed in JP-A-2002-524827 uses the primary electron beam itself as an electron beam for surface charge control and as it needs to irradiate the same area twice with the same electron beam, it has a disadvantage regarding the measurement and inspection efficiency. Also, in the technique described in JP-A-10-339711, the separate detection of the secondary electron beams generated from the sample by the irradiations of both of the electron beam for surface charge control and the electron beam for signal acquisition cannot be conducted. Therefore, the secondary charged particles generated by the electron beam irradiation for surface charge control and the electron beam irradiation for signal acquisition are detected being intermixed and the position information of the generation position of the secondary charged particles is lost from the detection signal.

An object of the present invention is to realize an electron beam apparatus which can achieve both of the excellent convergence of the primary beam and the surface charge control. Or, in addition to the above, it has an object to realize an electron beam apparatus which has a higher inspection and measurement throughput than the conventional.

In the present invention, the above-mentioned objects are achieved by being provided with a feature which separates the electron beams generated from the same electron source into at least two, irradiates the one as an electron beam for surface charge control and the other as an electron beam for generation of the secondary charged particle (the secondary electron and the back scattering electron) on the sample, and can detect the secondary charged particle generated by the irradiation of the electron beam for generation of secondary charged particle (hereinafter it will be called an electron beam for signal acquisition in short) distinctively from the secondary charged particle generated from the irradiation of the electron beam for surface charge control.

The number of the electron beam for signal acquisition may be one or more than one. The case where the number is only one corresponds to a single beam type and the case where the number is more than one corresponds to a multi beam type, and by making the number of electron beam for signal acquisition to be multi beam type, it is possible to realize a charged particle beam apparatus which has a high throughput in addition to the convergence of the primary beam and the surface charge control.

According to the present invention, it is possible to realize an electron beam apparatus which can achieve both of the convergence of the primary beam for signal acquisition and the surface charge control. Further, it is possible to realize an electron beam apparatus which has a high throughput in addition to achieving both of the convergence of the primary beam and the surface charge control by applying the present invention to the electron beam apparatus of multi beam type.

DESCRIPTION OF THE EMBODIMENTS

Embodiments of the present invention will be explained in detail based on the figures below. Here, in all of the figures to explain the embodiments, principally the same signs are used to the same members and their repeated explanations will be omitted. Each embodiment will be explained using the figures below.

Embodiment 1

In this embodiment, it will be explained about an embodiment in a so-called scanning electron microscope of single beam type. First, the type of the electron beam apparatus of this embodiment will be explained using FIGS. 1(a) to 1(d).

Figure 1:
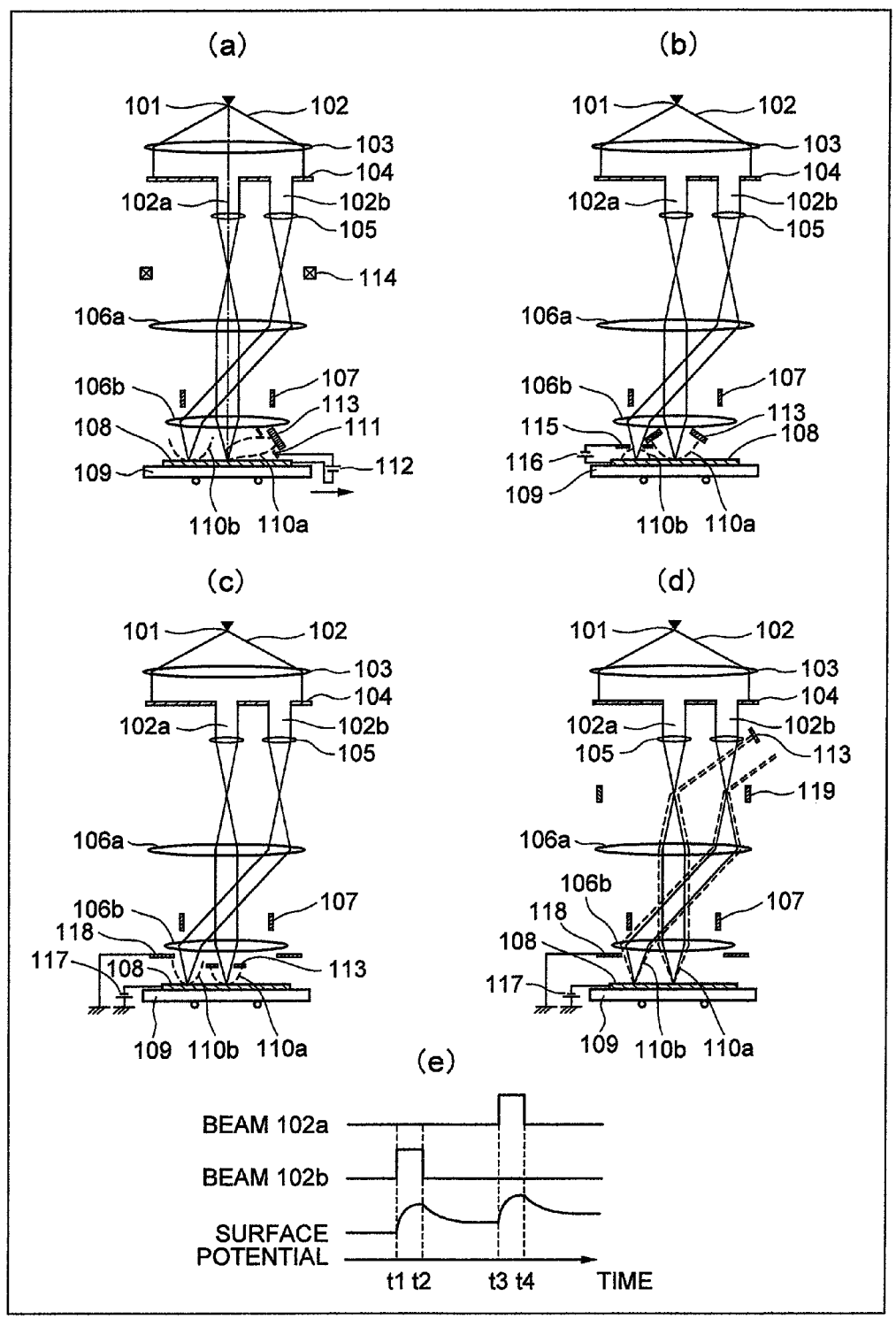
FIG. 1 is a diagram showing a schematic configuration of an electron beam inspection apparatus which explains a first embodiment of the present invention.

FIG. 1(a) is a diagram showing a schematic configuration of an electron optical system of the electron microscope according to the first embodiment. The electron optical system shown in FIG. 1(a) is configured with an electron source 101, a condenser lens configured with electromagnetic lens 103, an aperture array having a plurality of holes 104, a illumination optical system configured with a lens array 105, an object lenses 106a, 106b, a deflector to deflect a beam to scan a sample 107, etc., a detection optical system configured with a secondary electron detector 113, a collector electrode 111 to collect a secondary charged particle 110a generated by the irradiation of a primary beam 102a, etc., a stage 109, etc. Though not shown, the above-mentioned each component is hold in an electron optical column of which inside is evacuated. In the same way, though not shown, to each component part of the electron optical system, the sample stage 109, and the detection optical system, a driving power supply and a controller are connected respectively. Also, the controllers of each component are connected to a computer which controls those, and the control of the entire apparatus is supposed to be performed by said host computer. The above-mentioned electron optical column has a rotationally symmetric form and the one dotted chain line in the figure denotes the central axis of the electron optical column. The central axis of the electron optical column matches the axis of symmetry of the optical system in the design and it becomes the standard of the primary electron beam path. Hereinafter the above-mentioned axis of symmetry of the optical system will be called a central axis.

A primary beam 102 generated from the electron source 101, after being adjusted in parallel by the condenser lens 103, is split into two primary beams, a primary beam for signal acquisition 102a and a primary beam for surface charge control 102b by the aperture array 104. Afterward, the primary beam for signal acquisition 102a and the primary beam for surface charge control 102b, after being individually converged by the lens array 105, are focused on a sample 108 mounted on the stage 109 by the object lenses 106a and 106b. 107 is a deflector which generates an electric field or a magnetic field which changes timewise, and scans the primary beam for signal acquisition 102a and the primary beam for surface charge control 102b in the desired position on the sample 108.

In the electron optical system shown in FIG. 1(a), a rotation coil 114 is arranged in the crossover position in the lower part of the aperture array 104 which is the separation unit of the primary beam. The rotation coil 114 is a ring form coil which is arranged so that it is coaxial with the central axis of the optical system and it can generate the magnetic field which has the direction parallel to the central axis within the ring. The positions of the primary beam for signal acquisition 102a and the beam for surface charge control 102b on the sample can be rotated around the central axis by the magnetic field induced by the rotation coil 114. Using this, the primary beam for signal acquisition 102a and the beam for surface charge control 102b are aligned parallel to the moving direction of the stage. Here, in this embodiment, the stage 109 is controlled so that it repeats the temporary stop and the movement which is called a step and repeat. During the temporary stop the primary electron beam is irradiated scanning the sample 108 in two dimensions and the secondary electron signal is obtained synchronizing with the scanning signal. When the irradiation of the beam is terminated, a signal which indicates the termination is transmitted from the controller of the electron optical system to the controller of the sample stage and the sample stage controller controls so that the stage starts the movement.

By controlling the relative position of the irradiation positions of the primary beam for signal acquisition 102a and the beam for surface charge control 102b so that they become parallel to the movement direction of the stage, it becomes possible that the beam for surface charge control 102b conducts the beam irradiation almost tracing the exposure area of the primary beam for signal acquisition 102a, and the gap between the exposure area of the beam for surface charge control 102b and the exposure area of the primary beam for signal acquisition 102a is reduced. Here, if a rotation stage is added to a xy moving stage as a sample stage, it becomes possible to correct the adjustment of the irradiation positions of the primary beam for signal acquisition 102a and the beam for surface charge control 102b for the stage movement in the xy directions not only by the rotation coil 114 but also on the stage side. It is also possible to conduct this stage control so that the stage moves continuously and the primary beam is scanned in one dimension and the secondary electron signal is obtained being controlled linked with the stage.

The secondary charged particle such as the secondary electron and the reflected electron is generated from the sample 108 by the irradiation of the primary beam for signal acquisition 102a and the primary beam for surface charge control 102b. The detector 113 detects the secondary charged particle 110a which is generated by the irradiation of the primary beam for signal acquisition 102a among these. On this occasion, if a secondary charged particle 110b generated by the irradiation of the beam for surface charge control 102b is mixed, as the S/N ratio of the detected signal is decreased, in order to separate the secondary charged particle 110a generated by the irradiation of the primary beam for signal acquisition 102a and the secondary charged particle 110b generated by the irradiation of the beam for surface charge control 102b, the position of the detector 113 and the direction of the detection surface, further, the electric field distribution between the position in which the primary beam for signal acquisition 102a and the primary beam for surface charge control 102b are irradiated and the detector 113 are adjusted. In this embodiment, the collector electrode 111 to collect the secondary charged particle 110a generated by the irradiation of the primary beam for signal acquisition 102a and a power supply 112 to supply the voltage to the same are provided in front of the detector 113. The signal detected by the detector 113 is converted to the image data, etc. after being amplified and digitalized by a signal processing system (not shown). It is possible to inspect the form, the existence of defect, etc. of the pattern formed on the sample based on this image data or the obtained signal.

As a separation unit of the secondary charged particle 110a generated by the irradiation of the primary beam for signal acquisition 102a and the secondary charged particle 110b generated by the irradiation of the beam for surface charge control 102b, in the configuration of FIG. 1(a), the collector electrode 111 is provided in front of the detector 113. To the collector electrode 111 the voltage supply power supply 112 is connected.

In FIG. 1(e), a time chart which shows the relationship between the irradiation intensity of the primary beam for signal acquisition 102a and the primary beam for surface charge control 102b and the surface potential of the sample is shown. When the stage 109 moves in the direction of the arrow (from the left to the right on the page) in FIG. 1(a), the primary beam for surface charge control 102b is irradiated from time t1 to t2 on FIG. 1(e), afterward, the primary beam for signal acquisition 102a is irradiated from time t3 to t4 on the same position as the exposure area of the beam 102b. The surface potential of the sample changes the potential from the time t1 to t2 by the irradiation of the beam for surface charge control 102b. When the irradiation of the beam is stopped at the time t2, the potential state of the sample is attenuated and begins to return to the potential state before the t1. Afterward, from the time t3 to t4, the sample is surface charged again by the irradiation of the primary beam for signal acquisition 102a and the potential changes.

If it is possible to surface charge the sample which is covered with an insulation film to the desired potential and change the secondary electron generation efficiency from the sample by these irradiations, it is possible to improve the S/N ratio of the signal obtained from the detector 113. However, there is a case where the time constant of the attenuation of the surface charge of the sample is short depending on the condition such as the quality of the material, the film thickness, etc. of the sample surface. Therefore, when the space between the position of the irradiation of the primary beam for surface charge control 102b and the position of the irradiation of the primary beam for signal acquisition 102a is large, as the time from when the surface potential of the sample reaches the desired potential by the irradiation time of the primary beam for surface charge control 102b to when the primary beam for signal acquisition 102a is irradiated becomes long, the surface charge is greatly attenuated before detecting the signal of the secondary charged particle and the effect of the primary beam for surface charge control becomes smaller.

Conventionally, the surface charge control of the sample was often conducted using the preliminary irradiation electron source provided apart from the electron source which generates the primary beam for signal acquisition. However, with the conventional technique it was difficult to make the irradiation position of the primary beam for signal acquisition and the irradiation position of the beam for surface charge control close within a certain distance because of the problem of the physical size of the electron optical column and the electron source. For this reason, with the conventional technique it is needed at least about a few tens seconds of time from the irradiation of the preliminary irradiation electron beam to the irradiation of the primary beam for signal acquisition and there was a case where the surface charged state of the sample cannot be maintained to the irradiation of the primary beam depending on the quality of the material and the film thickness of the sample surface.

On the other hand, in this embodiment, as the primary beam generated from the same electron source is split into two and the one is irradiated as a primary beam for surface charge control 102b and the other as a primary beam for signal acquisition 102a on the sample, the distance between the primary beam for surface charge control 102b and the primary beam for signal acquisition 102a can be short compared with the case where the electron beam is irradiated from physically another electron source. For this reason, the signal detection of the secondary charged particle can be conducted before the attenuation of the surface charge potential of the sample regardless of the quality of the material and the film thickness, etc. of the sample surface. Thereby it becomes possible to form the image which has the high contrast and the uniform image quality. In addition, in this embodiment, it is possible to control the interval between the timing of the primary beam for signal acquisition and the timing of the beam for surface charge control to the desired position on the sample (namely, the interval between the time t2 and t3 of FIG. 1(e)) by controlling the velocity of the stage 109. This control of the interval between the timings also can be realized by adjusting the convergence condition of the convergence lens of the primary beam and changing the irradiation position of the primary beam for signal acquisition and the irradiation position of the beam for surface charge control. More specifically, the optimum interval between the t2 and t3 according to the quality of the material and the film thickness of the sample is found previously and is stored in a database. The database can be realized, for example, by storing the characteristic information of the sample such as the quality of the material, the film thickness, etc. and the optimum value of t2-t3 in pairs in a storage device which is connected to or is built in the above-mentioned computer. In the case where the interval control is conducted by the stage control, the computer retrieves the interval value of t2-t3 with the characteristic information of the sample as a key, calculates the optimum feed rate of the stage based on the obtained value, and transmits it to the stage control unit. In the case where the interval control is conducted by the adjustment of the convergence condition of the convergence lens of the primary beam, the optimum value of the interval between the irradiation position of the primary beam for signal acquisition and the irradiation position of the beam for surface charge control is calculated from the relationship between the interval value of t2-t3 which was retrieved in the same way and the present stage feed rate, and the exciting current or the apply voltage to the convergence lens is calculated with said optimum value as a control objective. The calculated values are transmitted to the electron optical system controller and the interval between the irradiation position of the primary beam for signal acquisition and the irradiation position of the beam for surface charge control is adjusted. Above, by the configuration of FIG. 1(a), the surface charge control according to the characteristic of the surface charge alleviation which differs depending on the sample becomes possible.

In FIGS. 1(b) to 1(d), other examples of the configuration of this embodiment are shown. The explanations will be described below, but about the same components as FIG. 1(a) the explanations will be omitted.

In FIG. 1(b), an example in which the separation unit of the secondary charged particle 110a cased by the irradiation of the primary beam for signal acquisition 102a and the secondary charged particle 110b caused by the beam for surface charge control 102b is configured with a filter electrode 115 and a voltage supply power supply 116 is shown. By the filter electrode 115, the track of the secondary charged particle 110b generated by the irradiation of the beam for surface charge control 102b is pulled back to the sample and its being mixed to the detector 113 is prevented.

In FIG. 1(c), a power supply 117 is connected to the sample 108 and a ground electrode 118 is provided in the upper stream in the electron gun direction of the sample, and the voltage may be applied to the sample 108 and the ground electrode 118 so that the sample 108 becomes lower, namely relatively negative, than the ground electrode 118, and the secondary charged particle generated from the sample 108 may be accelerated in the direction getting farther from the sample. In FIG. 1(c), the ground voltage is always connected to the ground electrode 118 and the negative voltage is applied to the sample 108. Thereby, as the directions of the secondary charged particles generated from the same position are unified, the secondary charged particle 110a generated by the irradiation of the primary beam for signal acquisition 102a and the secondary charged particle 110b generated by the irradiation of the beam for surface charge control 102b locally exist individually from each other and not get mixed with each other. Therefore, the separation of the both becomes possible as they are without generating the attraction electric field for the separation as in FIG. 1(a). For example, it is possible to separate and detect only the secondary charged particle 110a generated by the irradiation of the primary beam for signal acquisition 102a by installing the detector 113 which has the throughholes to pass the primary beam for signal acquisition 102a on its path. Also, the secondary electrons can be separated more effectively by combining FIG. 1(b) and FIG. 1(c). Namely, it may be controlled such as that the power supply 117 is connected to the sample 108 and the track of the secondary charged particle 110b generated by the irradiation of the beam for surface charge control 102b is pulled back to the sample using the filter electrode 115 while accelerating the secondary charged particle generated from the sample 108 in the direction getting farther from the sample.

In FIG. 1(d), an example in which the separation unit is configured with the arrangement of the secondary charged particle detector 113 and a Wien filter. The Wien filter is a deflector in which the electromagnetic field is superposed and is a kind of deflector which does not have the deflection effect for the primary beam and has the deflection effect only for the secondary charged particle. It is also called an E cross B deflector. In the configuration of FIG. 1(d), a Wien filter 119 is arranged in the crossover position of the primary beam which is formed between the lens array 105 and the object lens 106a. The secondary charged particle detector 113 is arranged in the moving direction in which the secondary charged particle is separated from the irradiation light axis of the primary beam for signal acquisition 102a and moves. On this occasion, the voltage is applied to the sample 108 and the electric field is formed between the sample 108 and the ground electrode 118 so that it becomes the acceleration electric field for the secondary particle. The secondary charged particles generated from the sample reach the Wien filter 119 passing the almost same paths as the primary beam for signal acquisition 102a and the beam for surface charge control 102b by the convergence effect of the acceleration electric field and the object lenses 106a and 106b. However, as the irradiation light axes are different with the primary beam for signal acquisition 102a and the beam for surface charge control 102b, the convergence positions by the Wien filter of the secondary charged particles generated differ from each other. Therefore, it is possible to detect only the secondary charged particle 110a generated by the irradiation of the primary beam for signal acquisition 102a by arranging the position of the arrangement of the secondary charged particle detector 113. Here, though not shown, it may have a configuration in which a shielding board is provided between the irradiation positions of the primary beam for signal acquisition 102a and the primary beam for surface charge control 102b to prevent the secondary electron from being mixed.

Here, in this embodiment, the effect of the present invention has been explained taking the electron microscope as an example, but the effect of the present invention can be obtained in the same way in a CD (critical dimension) SEM which measures the size of the pattern formed on the sample, a detector which checks the existence of the defect in the pattern formed on the sample, a review SEM which observes the defect of the pattern formed on the sample, etc.

Embodiment 2

In this embodiment, it will be explained about an apparatus configuration in the scanning electron microscope of multi beam type which separates the electron beam emitted from the same electron source into a plurality of electron beams and uses at least one or more than one electron beams as an electron beam for surface charge control.

Figure 2:
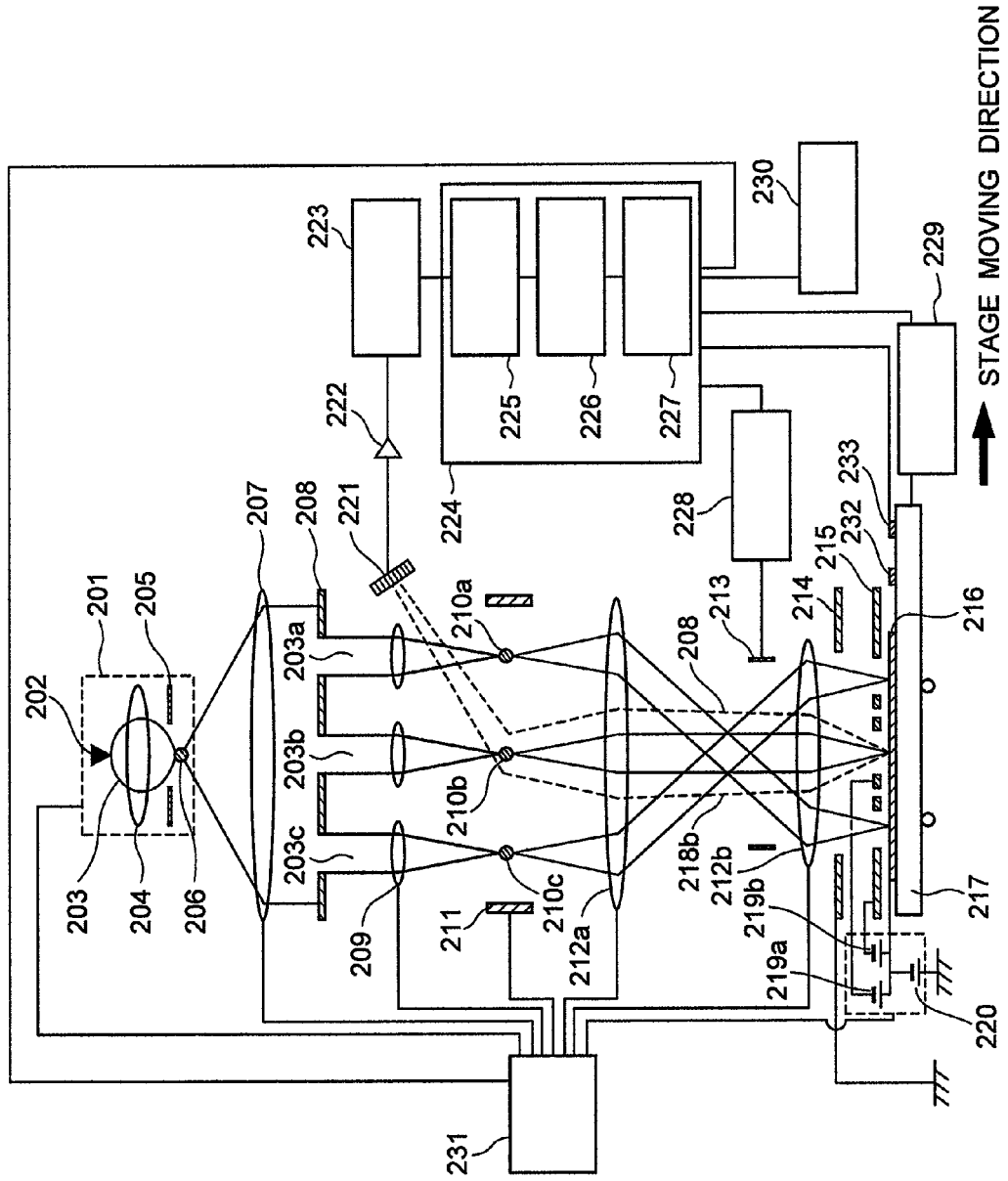
FIG. 2 is a schematic configuration diagram of the electron beam inspection apparatus of a second embodiment.

FIG. 2 is a diagram showing a schematic configuration of an electron beam inspection apparatus according to a second embodiment of the present invention. In this embodiment, it is configured being provided with an electric field strength control unit which makes the potential distributions on the sample different distributions in the irradiation positions of the primary beam for surface charge control and the primary beam for inspection. More specifically, a surface electric field control electrode is installed as this electric field strength control unit to control the electric field distribution on the sample. It will be described in detail later about this control of the electric field distribution on the sample. First, the apparatus configuration will be explained. An electron gun 201 includes an electron source 202 consisting of a substance which has a low work function, an anode 205 which has a higher potential than the electron source 202, and an electromagnetic lens 204 which superposes the magnetic field on the acceleration electric field formed between the electron source and the anode. In this embodiment, an electron source of Schottky type with which a large current can be obtained and the electron emission is stable is used. It is configured arranging a condenser lens 207, an aperture array 208 in which a plurality of apertures are arranged on the same substrate, a lens array 209 which has a plurality of apertures, a Wien filter 211, object lenses 212a, 212b, a deflector to deflect a beam to scan a sample 213, a stage 217, a secondary electron detector 221, etc. in the lower stream direction in which a primary electron beam 203 is pulled out from the electron gun 201. Further, in the electron optical system, a stop for current limitation, an aligner for adjustment of central axis (light axis) of the primary beam, an aberration corrector, etc. are also added (not shown). A stage 217 moves having a wafer 216 mounted on it. The negative potential (hereinafter it will be called a retarding potential) is applied to the wafer 216 as described later. Though not shown, it is configured that a wafer holder is interposed between the wafer 216 and the stage 217 in the condition that it is conductive with the wafer, and the desired voltage is applied to the wafer holder and the wafer 216 connecting a retarding power supply 220 to this wafer holder. On the electron gun direction side from the wafer 216, a grounded ground electrode 214 and a surface electric field control electrode 215 are installed. A scanning signal generation device 228 is connected to the deflector to deflect a beam to scan a sample 213 and a surface electric field control power supply 219 is connected to the surface electric field control electrode 215. To each part of the electron gun 202, the condenser lens 207, the lens array 209, the Wien filter 211, the object lenses 212a and 212b, the surface electric field control power supplies 219a, 219b, and the retarding power supply 220 an optical system control circuit 231 is connected, further, to the optical system control circuit 231a system control part 224 is connected. To the stage 217 a stage controller 229 is connected, further, in the same way as the secondary electron detector 221 and the deflector to deflect a beam to scan a sample 213, the system control part 224 is connected. In the system control part 224, a storage device 225, an operation part 226, and a defect determination part 227 are arranged and an image display part 230 is connected thereto. Also, though not shown, it is needless to say that the components other than the control system and the circuit system are arranged in a vacuum container and they are operated being evacuated. Also, it is needless to say that a wafer carrying system which arranges the wafer from the outside of the evacuation onto the stage is equipped. A standard mark 232 which is used for the adjustment of the electron optical condition and the measurement of the adjustment condition and a Faraday cup 233 which measures the current amount of the electron beam are provided on the stage.

Next, the operation of the apparatus and its detail will be explained. The primary beam 203 emitted from the electron source 202 is accelerated in the direction of the anode 205 receiving the convergence effect by the electromagnetic lens 204 and forms a first electron source image 206 (a point in which the beam diameter becomes the smallest). Though not shown, a stop is arranged in the electron gun 201 as often seen in a typical electron gun, and it is configured so that the electron beam within the desired current range passes through the stop. It is possible to adjust the current amount of the primary beam which passes through the stop to the desired current amount by changing the operation condition of the anode 205 and the electromagnetic lens 204. Also, though not shown, an aligner which corrects the light axis of the primary electron beam is arranged between the electron gun 201 and the condenser lens 207 and it is configured so that it can be corrected when the central axis of the electron beam is shifted from the stop and the electron optical system.

The condenser lens 207 aligns the primary beams in parallel with the first electron source image 206 as a light source. In this embodiment, the condenser lens 207 is an electromagnetic lens. In this embodiment, the aperture array 208 has three apertures arranged in the same straight line and splits the primary beam 203 into three beams in total of one primary beam for inspection 203b and two primary beams for surface charge control 203a, 203c. The split primary beams 203a, 203b, 203c are individually converged by the lens array 209 and a plurality of second electron source images 210a, 210b, 210c are formed. The lens array 209 includes three electrodes which have a plurality of apertures respectively, and it effects as an eintzel lens for the primary beam which passes through the aperture part by applying the voltage to the central electrode among these.

The three primary beams 203a, 203b, 203c which are individually converged by the lens array 209 pass through within the Wien filter 211. The Wien filter 211 generates the magnetic field and the electric field which cross at right angles each other within a plane almost vertical to the entering direction of the primary beam and gives a deflection angle to the electron which is passing corresponding to its energy. In this embodiment, the strength of the magnetic field and the electric field are set so that the primary beam proceeds straight, further, the strength of the electromagnetic field is adjusted and controlled so that the secondary electron beam which enters from the opposite direction is deflected in the desired angle. Also, about the position of the Wien filter 211, in consideration of the effect of the aberration for the primary beam, it is arranged in alignment with the height of the second electron source image of the primary beam to reduce the effect. 212a, 212b are one set of object lenses and are electromagnetic lenses respectively, and project second electron source images 210a, 210b, 210c in scale-down.

The deflector to deflect a beam to scan a sample 213 is configured with the electrostatic 8 electrode type in the object lens. When a signal is input to the deflector 213 by the scanning signal generation device 228, the three primary beams which pass through inside receive the deflection effect only in the almost same direction and in the almost same angle, and raster scan the wafer 216 which is the sample. To the wafer 216 the negative potential is applied by the retarding power supply 220. Therefore, the electric field which decreases the rate of the primary beam is formed between this and the ground electrode 214 connected to the ground potential. The surface electric field control power supplies 219a, 219b, and the retarding power supply 220 are collectively controlled by the system control part 224 via the optical system control circuit 231 in the same way as the other optical devices, namely, the electron gun 201, the condenser lens 207, the lens array 209, the Wien filter 211, and the object lenses 212a and 212b.

The stage 217 is controlled by the stage controller 229. The system control part 224 collectively controls the scanning signal generation device 228 and the stage controller 229 so that a designated area on the wafer 216 is inspected by one stripe which is aligned in the stage moving direction. Here, in the inspection apparatus of this embodiment, the stage moves continually, and it is controlled so that the primary beam sequentially scans the areas in belt forms by the combination of the deflection by the scan and the stage movement. This belt like area is an area into which a designated inspection area is divided, and the entire designated inspection area is scanned by scanning a plurality of belt like areas. Each of this belt like areas is called a stripe. The movement of the stage and the arrangement of the primary beam for inspection, the primary beam for surface charge control are controlled so that the primary beam for inspection and the primary beam for surface charge control become almost parallel to the stage moving direction in the same way as the first embodiment, and it is configured so that the beam for inspection can irradiate the almost same area as the beam for surface charge control or the inside area of the exposure area of the beam for surface charge control. The relationship between the beam and the stage may be that the stage control part controls correcting the x, y directions of the stage to the small rotation angle Θ in the same way as the first embodiment, or the rotation of the arrangement of the beam may be adjusted by the rotation coil (not shown). The system control part 224 collectively controls these controls.

Figure 3:
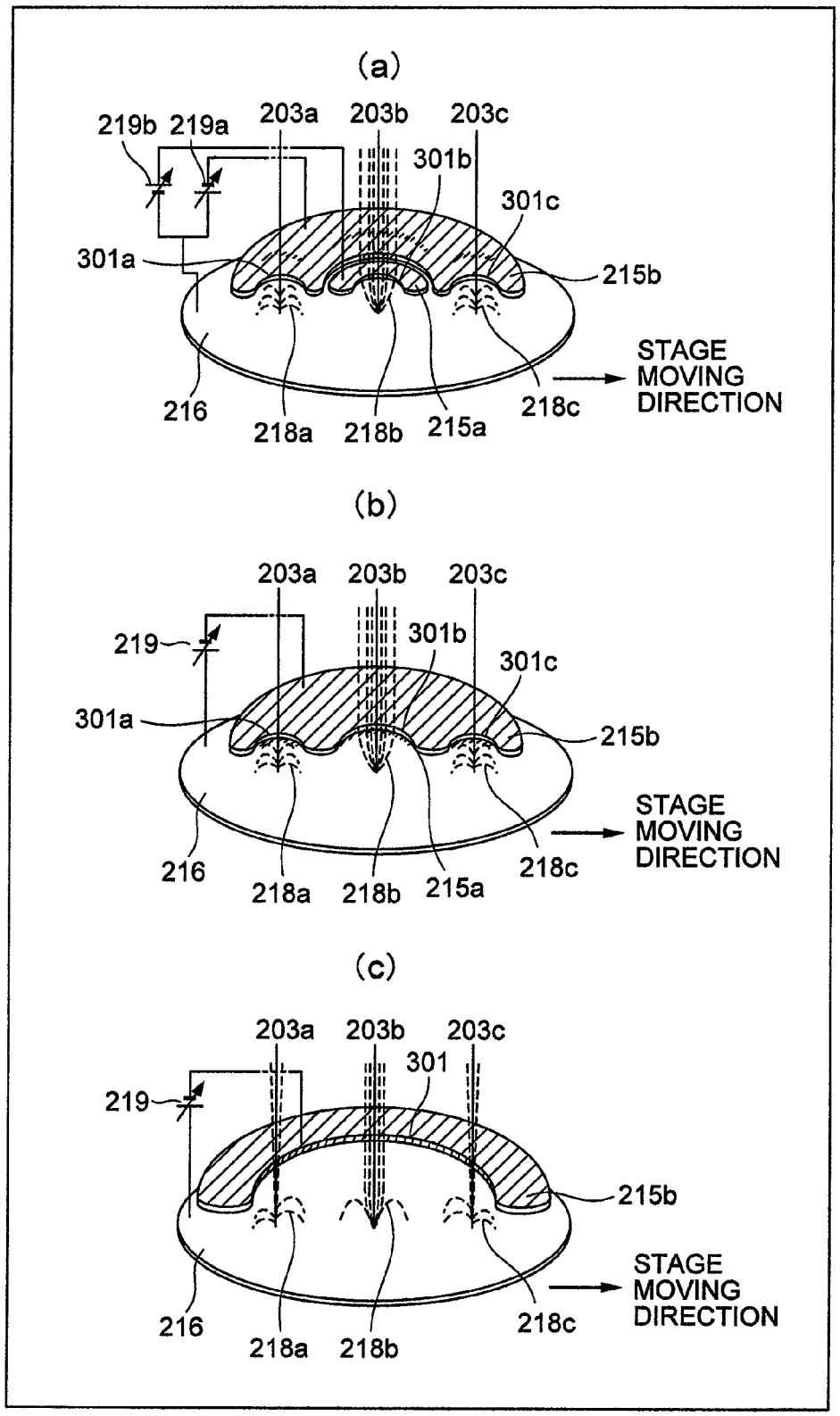
FIG. 3 is an enlarged diagram of a surface electric field control electrode and a wafer in the vicinity in the electron beam inspection apparatus of FIG. 2.

Next, the effect of the surface electric field control electrode 215 will be explained assuming that the stage is moving in the right direction on the page as shown by the arrow in the figure. FIG. 3 is an enlarged diagram of a part including the surface electric field control electrode 215 and the wafer 216 in the electron beam inspection apparatus of FIG. 2. Here in FIG. 3, in order to show the arrangement and the configuration of the wafer 216 and the surface electric field control electrode 215 easily to understand, the surface electric field control electrode 215 is shown relatively more enlarged compared to the wafer 216. Practically, the intervals between the beams 203a, 203b, 203c are configured with the size no more than a few parts of the wafer 216. Also, typically it is shown that a wire from the surface electric field control power supply 219 is connected to the wafer, but in practice the wire from the power supply is connected to a holder (not shown) immediately under the wafer, and it is not that the wire is directly connected to or contacted with the wafer and hurts the wafer surface directly.

In this embodiment, as shown in FIG. 3(a), the surface electric field control electrode 215 is electrically separated into two sections of the electrode 215a and 215b. Between the sections of the electrode 215a and 215b, though not shown, it is configured interposing an insulation material. A throughhole 301b is provided in the section of the electrode 215a and throughholes 301a and 301c are provided in the section of the electrode 215b. The three throughholes 301a, 301b, 301c are all circles which have an equal diameter, and the primary beam for surface charge control 203a passes through the throughhole 301a, the primary beam for inspection 203b passes through the throughhole 301b, and the primary beam for surface charge control 203c passes through the throughhole 301c respectively. The surface electric field control power supply 219a gives a potential difference between the wafer 216 and the section of the electrode 215a and the surface electric field control power supply 219b gives a potential difference between the wafer 216 and the section of the electrode 215b.

On the other hand, as it has already been described, the negative potential to decrease the rate of the primary beam is applied to the wafer 216. This potential has the acceleration effect for the secondary charged particle which has the moving direction opposite to the primary beam. The behavior of the secondary charged particle generated from the wafer 216 with the irradiation of the primary beam is determined by the balance between this acceleration effect and the effect by the potential difference applied between the sections of the electrode 215a and 215b and the wafer 216. In this embodiment, the potential difference of +100 V for the wafer 216 is given to the section of the electrode 215a and the potential difference of −100 V for the wafer 216 is given to the section of the electrode 215b. Thereby the electric field in the direction which pulls back the secondary electron generated from the sample to the sample is formed in the area where the primary beams for surface charge control 203a and 203c are irradiated, and the electric field in the direction which accelerates the secondary electron generated from the sample to the electron gun direction is formed in the area where the primary beam for inspection 203b is irradiated. Namely, the secondary charged particle 218a generated by the interaction between the primary beam 203a and the wafer 216 and the secondary charged particle 218c generated by the interaction between the primary beam 203c and the wafer 216 are pulled back to the wafer 216 to control the surface charged state of the sample, on the other hand the secondary charged particle 218b generated by the interaction between the primary beam 203b and the wafer 216 gets farther from the wafer 216 and proceeds toward the upper direction. Therefore, the surface electric field control electrode 215 of this embodiment also has the effect to separate the secondary charged particle generated by the irradiation of the primary beam for surface charge control and the secondary charged particle generated by the irradiation of the primary beam for inspection. Also, when the electric field in the direction to pull back the secondary electron to the sample is formed in the area where the primary beam for signal acquisition is to be irradiated, as the electric field distribution on the path of the primary beam changes at the same time, there is a case where the beam blur of the primary beam by the chromatic aberration and the non point aberration increases, but in this embodiment, the electric field to pull back the secondary electron to the sample is not formed in the area where the primary beam for signal acquisition is to be irradiated. For this reason, the blur of the primary beam for signal acquisition is not supposed to be increased.

Next, the role of the primary beams for surface charge control 203a and 203c will be explained. Now, as the wafer 216 proceeds in the right direction of the page with the stage, the first to be irradiated in the inspection area is the primary beam for surface charge control 203a. As it has already been described, as the secondary charged particle 208a generated by the interaction between the primary beam for surface charge control 203a and the wafer 216 is pulled back to the wafer 216 by the electric field formed by the section of the electrode 215a of the surface electric field control electrode 215, the inspection area is negatively surface charged. The next to be irradiated in the inspection area is the primary beam for inspection 203b. As it has already been described, the secondary charged particle 208b generated by the interaction between the primary beam for inspection 203b and the wafer 216 gets farther from the wafer 216 and proceeds toward the upper direction.

The behavior of the secondary charged particle 208b afterward will be explained using FIG. 2 again. The secondary charged particle 208b receives the convergence effect of the object lenses 212a and 212b, further it is separated from the track of the primary beam by the Wien filter 211 which has the deflection effect for the secondary charged particle and reaches the detector 221. The detected signal is amplified by an amplifier circuit 222, is digitalized by an A/D converter 223, and is temporally stored in the storage device 225 in the system control part 224 as image data. Thereafter, the operation part 226 performs the calculation of each kind of statistical amount of the image, and finally the defect determination part 227 determines the existence of the defect based on the pre-found defect determination condition. The determination result is displayed on the image display device 230.

With above procedures, the areas to be inspected within the wafer 216 is surface charge controlled by the primary beam for surface charge control 203a and the pattern inspection is conducted by the primary beam for inspection 203b sequentially from the right end. When the inspection is terminated at the left end of the area to be inspected, the moving direction of the stage is inverted to the left direction of the page to conduct the inspection of the adjacent stripe. Then, this time the primary beam for surface charge control 203c controls the surface charged state of the wafer 216, and further the inspection is conducted by the primary beam for inspection 203b.

With above method, it is possible to achieve both of the surface charge control and the inspection without decreasing the throughput by forming three primary beams using a single electron gun and using one as a primary beam for inspection and two for primary beams for surface charge control. Further, compared with the method in which the beam emitted from an electron source other than the electron gun which generates the primary beam for inspection is used as a primary beam for surface charge control, by using the beam which is emitted from the same electron gun and is irradiated on the wafer 216 using the same electron optical system as a primary beam for inspection and a primary beam for surface charge control, it becomes possible to shorten the distance between them. Thereby it becomes possible to shorten the time difference from when the surface charged state of the wafer is determined by the beam for surface charge control to when the pattern inspection is conducted by the primary beam for inspection, to maintain the surface charged state in good condition and to improve the defect detection sensitivity.

Next, it will be explained the procedure to conduct the inspection of the circuit pattern formed on the wafer using this electron beam inspection apparatus in the semiconductor device manufacturing process using FIGS. 4, 5, and 6.

Figure 4:
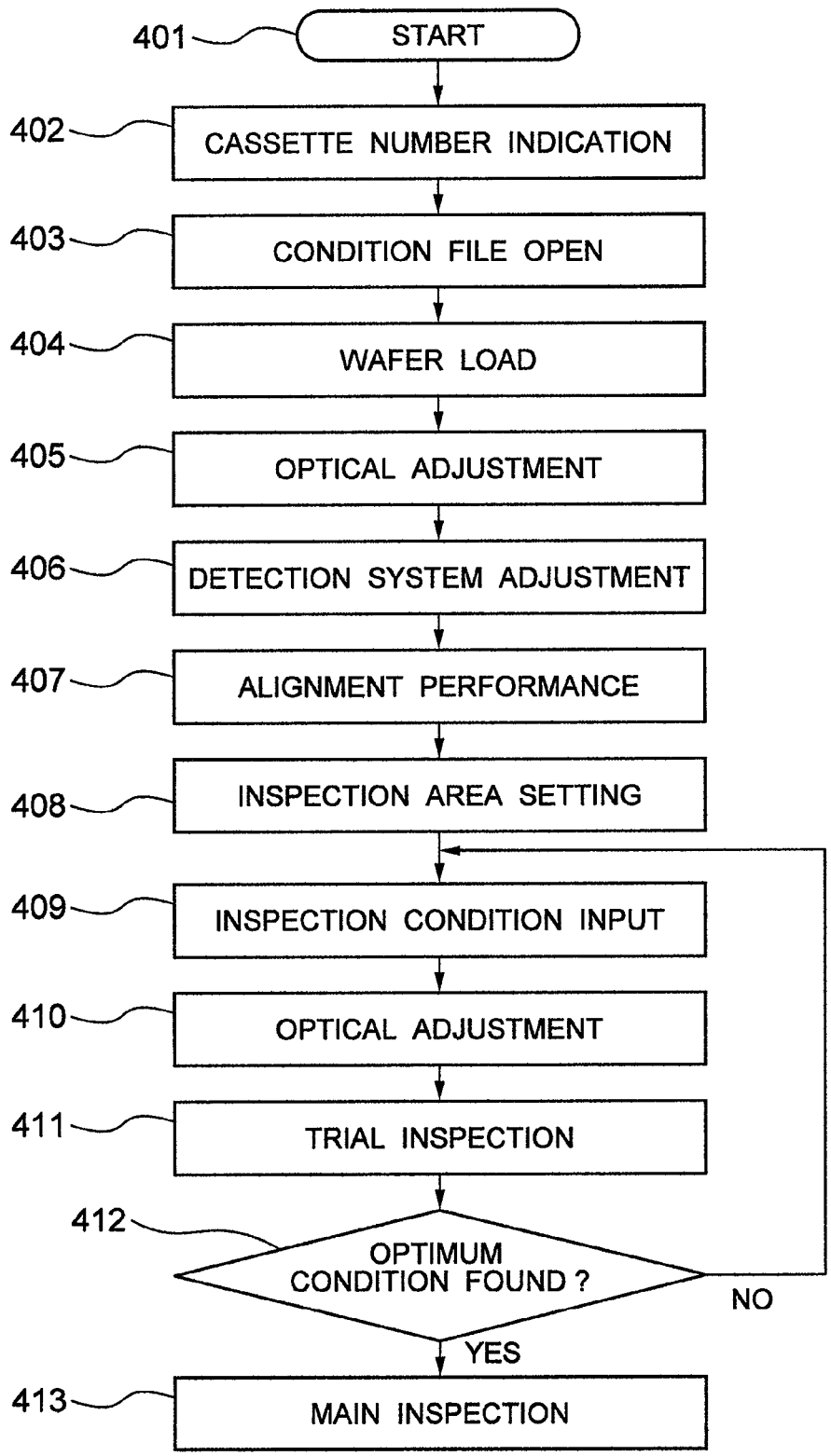
FIG. 4 is a flow chart showing procedures to conduct the inspection in the second embodiment.

FIG. 4 is a flow chart showing the procedure to conduct the inspection. When the operator clicks a start button displayed on the image display device 230 of FIG. 2 (step 401), an input screen is displayed to prompt the operator to indicate a cassette (not shown) in which a wafer to be inspected is stored. When a number of the cassette is input (step 402), an inspection condition setting screen as shown in FIG. 5 is displayed. Through this screen, the operator can select a condition file in which the inspection condition has already been written, can select whether to rewrite this as the need arises or to newly create one, and can write the inspection condition based on the default value. When the operator clicks a wafer indication tab 501 first, an input screen is displayed, and the operator inputs a lot ID to which the wafer to be inspected belongs and a wafer ID (step 403). The system control part 224 determines the wafer size, etc. based on these IDs and mounts the wafer on the stage 217 using a wafer loader (not shown) (step 404).

Next, when the operator clicks an optical adjustment button displayed on the image display device 230, the coarse adjustment of the electron optical system is started (step 405). The object of this coarse adjustment of the electron optical system is to coarsely adjust the electron beam to the desired condition and to correct when the light axis of the electron beam is remarkably shifted from the optical system. When the light axis of the beam is remarkably shifted, it sometimes happens that the current amount of the beam cannot be secured being obstructed by the optical system component such as a stop, etc. By correcting this, it has an effect to prevent the unexpected scattering of the current amount of a plurality of primary beams and it becomes possible to normally adjust the brightness at the detection system adjustment which is the next step. At the coarse adjustment, first the stage moves so that the primary beam for inspection 203b is irradiated on the standard mark 232 mounted on the stage 217 by the signal from the stage controller 229, and the beam diameter of the primary beam for inspection 203b and the deflection amount of the beam when the signal is given to the deflector 213 are measured. Here, the measurement values of the beam diameter and the deflection amount are calculated by that the control part image processes the image obtained at the standard mark. Further, the stage moves so that the primary beam for inspection 203b is irradiated on the Faraday cup 233 and the beam current of the primary beam for inspection 203b is measured. Next, the beam diameter, the deflection amount of the beam when the signal is given to the deflector 213, and the beam current are measured about the primary beams for surface charge control 203a, 203c in the same way. The measured beam diameter, deflection amount, and beam current are displayed on the image display device 230 with respect to each of the primary beam for inspection 203b, the primary beams for surface charge control 203a, 203c. The operator conducts the adjustment of the current and the voltage to be applied to the electron gun 201, the object lenses 212a, 212b, the aligner (not shown), the aberration corrector (not shown), etc. so that the beam diameters and the beam currents of the primary beam for inspection 203b and the primary beams for surface charge control 203a, 203c become the desired values seeing this display results. Further, the beam diameter, the deflection amount, and the beam current are measured again with respect to each of the primary beam for inspection 203b, the primary beams for surface charge control 203a, 203c, and the results are displayed on the image display device 230. These measurement and adjustment are repeated, and when the control system or the operator determines that they are close to the desired optical conditions, the adjustment is terminated. About this optical adjustment, the operator may repeat the adjustment as described above, or, the control system may be configured so that the control system automatically repeats the optical adjustment until they become the desired conditions only by that the operator previously inputs the desired values.

Next, when the operator clicks a detection system adjustment button displayed on the image display device 230, the detection system adjustment of the bias voltage applied to the detector 221, the offset voltage and the gain of the amplifier circuit 222, etc. is started, and the signal amount is adjusted to be the brightness within the appropriate range (step 406). Next, when the operator clicks an alignment button displayed on the image display device 230, the calibration of the stage coordinates for the wafer, namely the alignment, is performed (step 407). An indication screen for alignment is displayed and when the operator indicates a plurality of points of alignment chips on the wafer according to the indication, an alignment mark is automatically detected and an alignment coordinates are registered by the system control part 224. Next, the operator indicates the chip to be inspected within the wafer and the area to be inspected within the chip (step 408).

Figure 5:
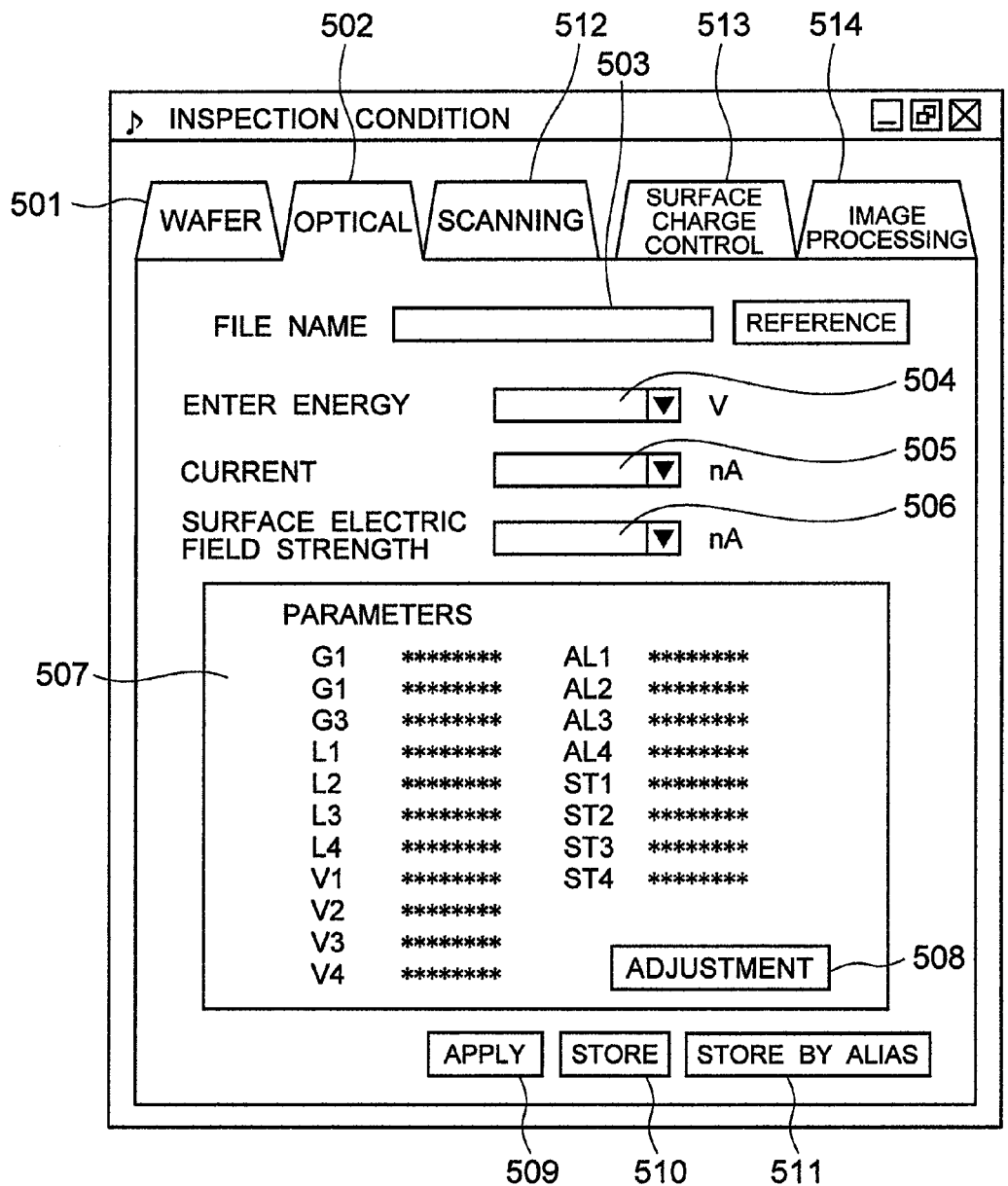
FIG. 5 is an inspection condition setting screen in the second embodiment.
Figure 6:
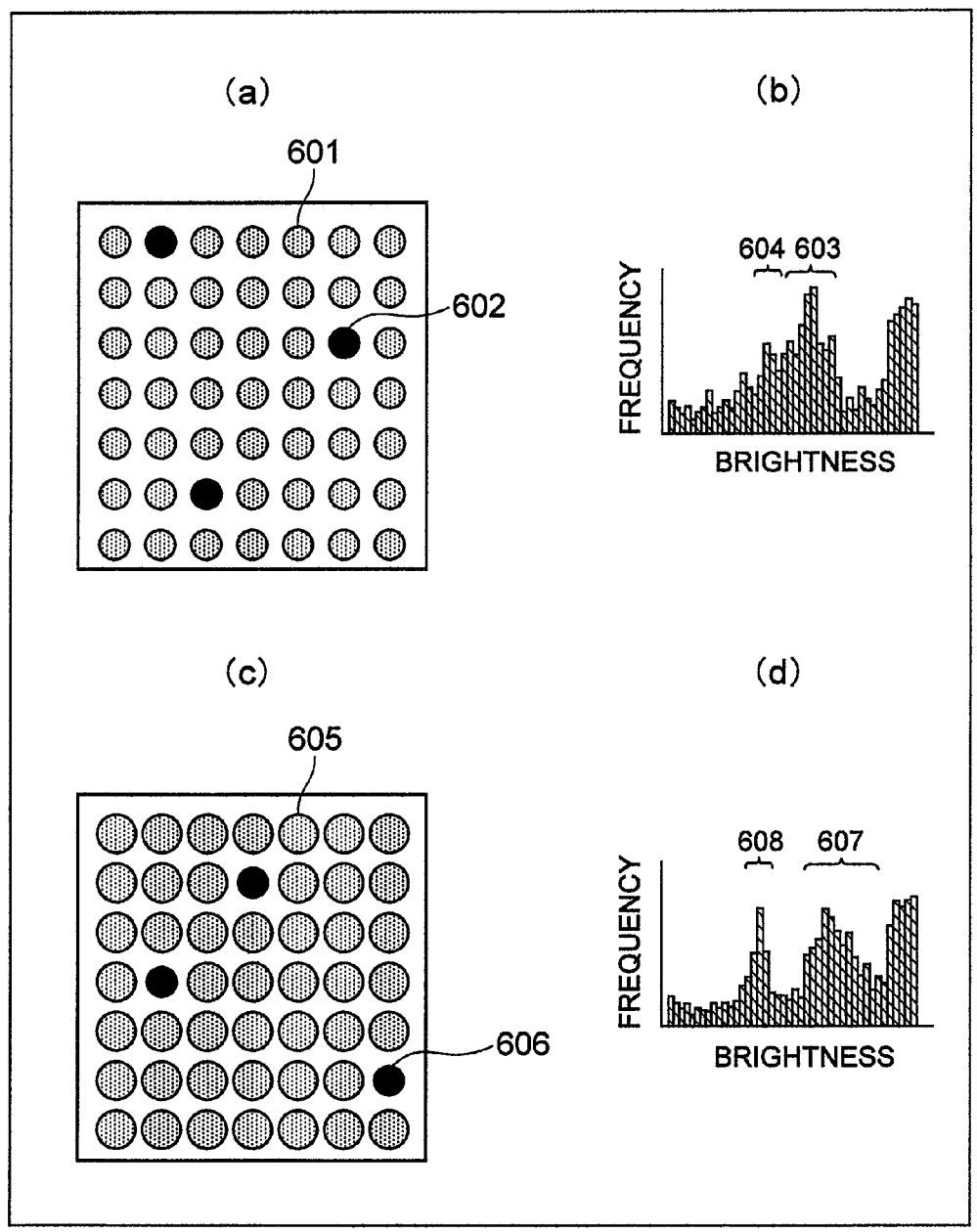
FIG. 6 is an image obtained by a trial inspection and a histogram display of the brightness of the image.

Next, the operator inputs the inspection condition using an inspection condition setting screen of FIG. 5 (step 409). First, the operator clicks an optical condition indication tab 502, and reads out the optical condition with which the inspection to be conducted from the file which has already been created through a file indication box 503 or newly inputs the enter energy and the current appropriate as the inspection conditions through an enter energy setting box 504 and a current setting box 505. The system control part 224 calculates the voltage to be applied to the electron gun 201, the output current and the output voltage of a pulled out electrode within the electron gun (not shown), the retarding power supply 220, and the electromagnetic lens 204 which superposes the magnetic field within the electron gun based on this. Also, when the operator inputs the surface electric field strength of the area where the primary beam for inspection is to be irradiated appropriate as the inspection condition through a surface electric field strength setting box 506, the system control part 224 determines the output voltage of the surface electric field control power supply 219 based on this.

At the same time as that the optimum values of other optical devices such as a lens, etc. are recalculated, the recalculated parameters are displayed on an optical parameter display part 507. When the operator wants to further adjust these parameters, the operator can make a screen for adjustment to be displayed by clicking an adjustment button 508. When the indication of the optical conditions is terminated and the operator clicks an apply button 509, the determined conditions are reflected to each optical device. Also, the operator can store the optical conditions by clicking a store button 510 or a store by alias button 511.

Next, when the operator clicks a scanning condition tab 512 and inputs the width with which the primary beam for inspection 203b scans on the wafer 216, the scanning rate, the scanning frame number, the timing of the rate signal detection of the stage, etc., the system control part 224 calculates the signals to be given to the scanning signal generation device 228 and the stage controller 229.

Next, the operator clicks a surface charge control tab 513 and inputs the surface electric field strength of the area where the primary beam for surface charge control is to be irradiated which is appropriate for the inspection condition. The system control part 224 determines the output voltage of the surface electric field control power supply 219a based on this and the voltage is applied.

Next, the operator clicks an image processing condition tab 514 and inputs the image processing condition of the kind of the filter to be used for the detected signal.

The above is the procedures with which the operator inputs each of the optical condition, the scanning condition, the surface charge control condition, and the image processing condition by the manual scanning, but the kind and the film pressure, etc. of the resist may be read out based on the lot ID or the wafer ID input by the wafer indication tab 501 and these conditions may be automatically set based on the inspection history, etc.

When the input of the inspection condition is terminated with the above-mentioned procedure, the operator clicks the optical adjustment button displayed on the image display device 230 as the need arises, and adjusts again the current and the voltage to be applied to the optical devices so that the beam diameters and the beam currents of the primary beam for inspection 203b and the primary beams for surface charge control 203a, 203c become the desired values (step 410). This step is aimed at conducting the precise adjustment of the electron optical system and confirming the adjustment condition.

Next, a trial inspection is conducted (step 411). FIG. 6(a) is an example of an image obtained by the trial inspection which is conducted about a small area within the designated chip under the conditions set by the above-mentioned steps. Among the patterns arranged on a matrix, the brightness differs in a normally formed pattern 601 and in a bad continuity pattern 602. The one which displays this brightness of the image in a histogram display is FIG. 6(b). A peak 603 corresponding to the normally formed pattern and a peak 604 corresponding to the bad continuity pattern can be slightly discriminated, but it can be hardly said that they are separated. When the operator determines that there is a possibility of the mistaken detection and that it is not the optimum condition based on the image and the histogram (step 412), the process returns to the step 409 again. In the example of FIG. 6(a), as it is determined that the contrast has become lower because of the insufficient surface charge, the surface electric field strength of the area where the primary beam for surface charge control is to be irradiated is adjusted so that the wafer gets more strongly surface charged. As the result, when the trial inspection is conducted again, the difference of the brightness of a normally formed pattern 605 and a bad continuity pattern 606 becomes greater as the image obtained by the trial inspection shown in FIG. 6(c). On this occasion, the histogram display of the brightness of the image becomes as FIG. 6(d) and a peak 607 corresponding to the normally formed pattern and a peak 608 corresponding to the bad continuity pattern are clearly separated. It is determined that the inspection and surface charge conditions with which the bad continuity part and the normal part can be clearly identified in this way are the conditions with which the desired surface charged state can be formed and they are supposed to be applied to the inspection. Here, the positions of the bad continuity patterns are different in FIGS. 6(a) and 6(c) because the areas of the first and second trial inspections have been changed to perform the second trial inspection without being affected from the history of the surface charge.

In this way, after finding the optimum condition by the adjustment, the operator clicks a detection button displayed on the image display device 230 and conducts the main inspection (step 413).

The above is the procedure when the first wafer of the lot in which a plurality of the same kind of wafers are included is inspected, but when the same kind of wafers are continually inspected, the input of the inspection condition may be omitted and the inspection may be repeated with the same condition. Also, if the optical adjustment and the detection system adjustment are omitted appropriately, it contributes to the improvement of the throughput.

Here, in this embodiment, the potential is individually controlled by separating the surface electric field control electrode into two, one for surface charge control and one for inspection and connecting each of them to separate power supplies as shown in FIG. 3(a), but simpler, a throughhole for surface charge control and a throughhole for inspection may be provided in the single surface electric field control electrode 215 as shown in FIG. 3(b). In this case, the voltage of the surface electric field control electrode is controlled as a single voltage and the surface electric field strength is determined by the diameters of the throughholes. Namely, by making the sizes of the throughholes 301a, 301c through which the primary beam for surface charge control passes and the throughhole 301b through which the primary beam for inspection passes different, although the surface electric field control electrode is a single voltage, the surface electric fields of the irradiation positions of the primary beam for inspection and the primary beam for surface charge control can be controlled to be the different electric fields. As the result, it is also possible to make the secondary charged particle 218b generated by the interaction between the primary beam for inspection and the wafer 216 proceed in the direction getting farther from the wafer 216 while pulling back a part of the secondary charged particles 218a, 218c generated by the interaction between the primary beam for surface charge control and the wafer 216 to the wafer 216. In this case, about the surface electric field strength of the exposure areas of the primary beam for inspection and the primary beam for surface charge control, if one of them is determined the single voltage of the surface electric field control electrode is determined, and as the result, the other is automatically determined. Also, as shown in FIG. 3(c), also in the case where the both of the primary beam for surface charge control and the primary beam for inspection pass through a common throughhole 301, if the difference of the surface electric field strength generated from the difference of the distance of the electrode and the both beams is used, it is possible to make the secondary charged particle 218b generated by the interaction between the primary beam for inspection and the wafer 216 proceed in the direction getting farther from the wafer 216 while pulling back a part of the secondary charged particles 218a, 218c generated by the interaction between the primary beam for surface charge control and the wafer 216 to the wafer 216.

Also, as shown in FIG. 3(c), even in the case where a part of the secondary charged particles 218a, 218c generated by the interaction between the primary beam for surface charge control and the wafer 216 is not pulled back to the sample and proceeds toward the upper direction, if the detector 221 is installed in the position where the secondary charged particle 218b generated by the interaction between the primary beam for inspection and the wafer 216 is sufficiently converged by the convergence effect of the object lenses 212a and 212b, etc., it is possible to separate it from the secondary charged particle generated by the interaction between the primary beam for surface charge control and the wafer 216 and to detect it with excellent S/N ratio. Here, in the case where the beam for inspection and the beam for surface charge pass through the common beam pass hole as shown in FIG. 3(c), it also becomes possible to change the irradiation position of the beam for surface charge by controlling the convergence lens unit, etc. and to adjust it to the desired distance between the beams. Thereby it becomes possible to control also the irradiation time interval between the beam for surface charge control and the beam for inspection to the desired time interval. When the beam pass holes are individually installed as in FIGS. 3(a), 3(b), as the beam interval was almost uniquely determined so that the beam passes almost in the center for each of the pass holes, the beam interval control like this is the unique effect of the case of the beam pass hole of FIG. 3(c).

Also, in FIG. 3(a), the two surface electric field control electrodes for surface charge control and for inspection are provided with the same height, but they can obtain the same effect being provided with the different heights.

Further, in this embodiment, the two beams for surface charge control are provided for one primary beam for inspection, but in the case where the moving direction of the stage being inspected is not inverted and it moves only in one direction, the beam for surface charge control may be one.

In order to perform the processing of the observation, the measurement, the defect review and classification, the inspection, etc. using the electron beam apparatus, it is necessary to separate and detect the plurality of secondary charged particles emitted from the sample by the irradiation of the plurality of beams. However, when the electric field in the vicinity of the sample surface is controlled to control the surface charged state, sometimes it becomes difficult to separate and detect the secondary charged particles generated from the plurality of places on the sample. The collective image-forming method and the multi column method have a lot of advantages but also have some disadvantages. The disadvantage of the collective image-forming method is that the improvement limit of the throughput is determined by the area of the area beam to be irradiated. As it is difficult to form a beam of large area with small aberration, in order to improve the throughput drastically, a certain breakthrough is necessary in respect of enlarging the area of the plane beam. The disadvantage of the multi column method is that the improvement limit of the throughput is determined by the number of the electron optical columns which can be arranged on the sample. There is a limit in making the electron optical column smaller, therefore the number of the optical columns which can be arranged on the sample cannot be drastically increased. Then, in the present invention, the throughput is improved adopting the multi beam method in which the electron beam generated at the same electron source is split into a plurality of beams and irradiated on the sample.

Embodiment 3

In the embodiment 2 the primary beam is split into three beams using the aperture array and the two of them are used for surface charge control and the one is for inspection. On this occasion, the almost equal current is given to the three primary beams by making the diameters of the plurality of apertures of the aperture array equal. However, with this embodiment there is a case where the irradiation intensity of the primary beam for surface charge control is not sufficient and the wafer is not surface charged sufficiently.

Figure 7:
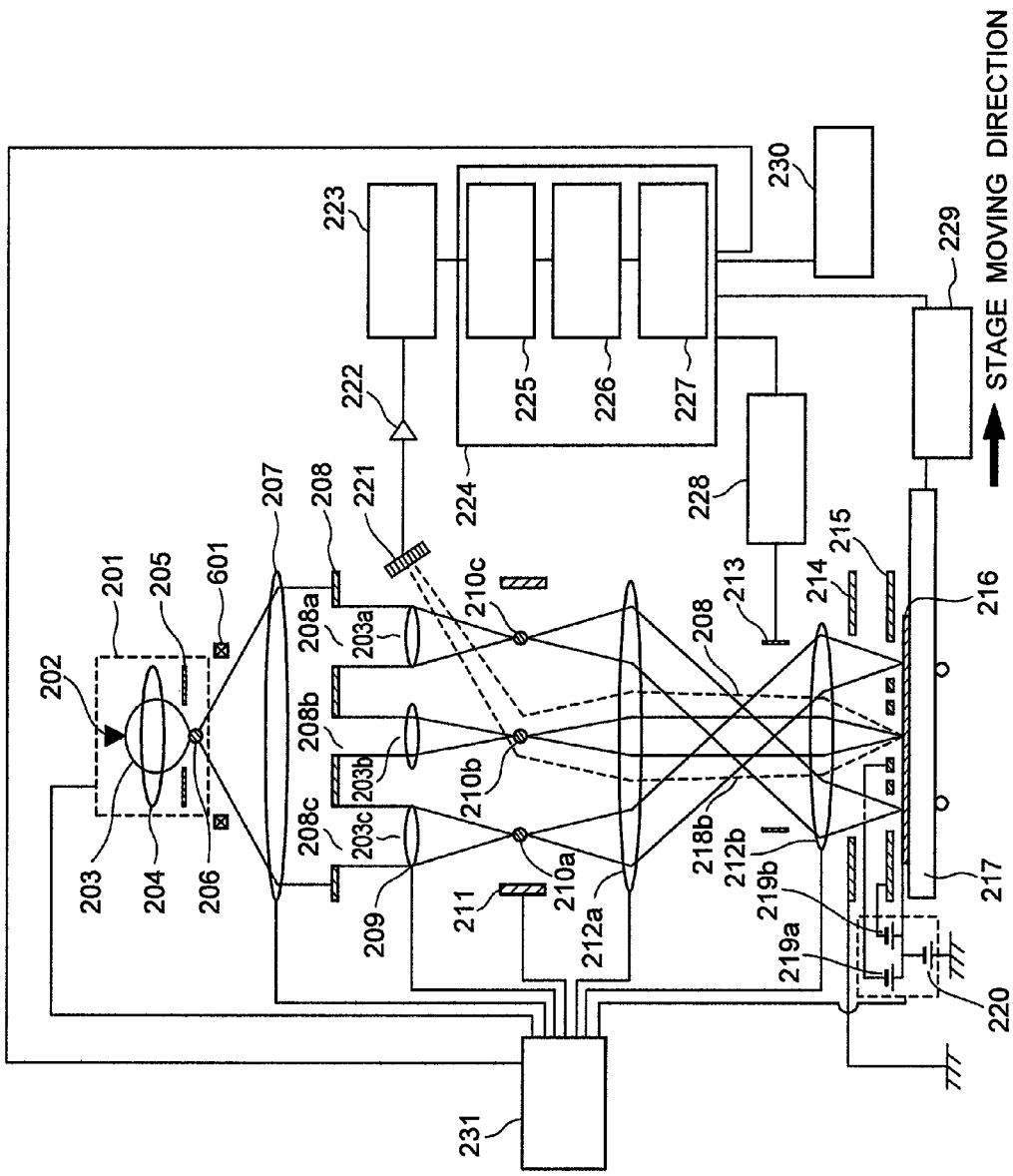
FIG. 7 is a schematic configuration diagram of the electron beam inspection apparatus of a third embodiment.

Then, in this embodiment, it is attempted to enlarge the current of the primary beam for surface charge control. FIG. 7 is a diagram showing a schematic configuration of an electron beam inspection apparatus according to a third embodiment of the present invention. In this embodiment also, in the same way as the embodiment 2, the primary beam is split into three primary beams 203a, 203b, 203c using the aperture array and among these 203a and 203c are used as the primary beam for surface charge control and 203b is used as the primary beam for inspection.

The currents of the three primary beams 203a, 203b, 203c are determined by the aperture diameters of the aperture array. In this embodiment, among the three apertures of the aperture array 108, the aperture diameters of apertures 208a, 208c which form the primary beams for surface charge control 203a and 203c are made to be bigger compared to the embodiment 2. On the other hand, about an aperture 208b which forms the primary beam for inspection 203b, it is made to have the same aperture diameter as the embodiment 1 in consideration of the aberration of the lens array 209 and the object lenses 212a, 212b and the Coulomb force. Thereby it becomes possible to surface charge the wafer 216 sufficiently strong while converging the primary beam for inspection sufficiently thin.

Embodiment 4

In the embodiment 2, the primary beam is split into three beams using the aperture array and two are used for surface charge control and one is for inspection. On this occasion, the three primary beams are all converged on the wafer and their diameters are also almost equal. However, in this embodiment, there is a case where the brightness of the image and the detection sensitivity become not uniform in the center and on the end of the image.

Figure 8:
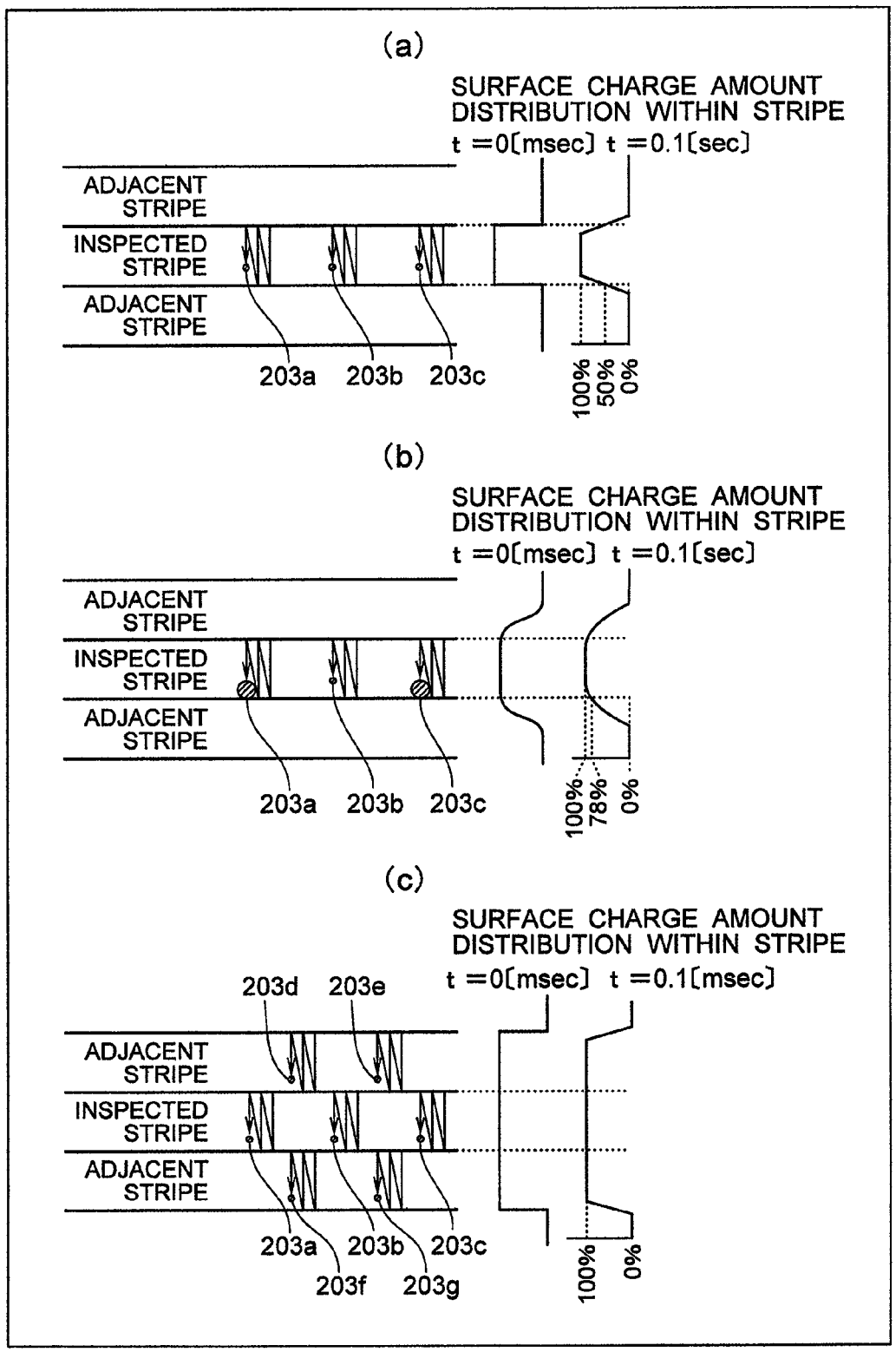
FIG. 8 is a diagram showing the correspondence of a scanning area of the beam and the surface charge amount distribution.

As one of the causes, the ununiformity of the surface charge amount can be thought of. It will be explained using FIG. 8. The left diagram of FIG. 8(a) is a conceptual diagram showing the movement of the beam seen from the wafer in the embodiment 2. It shows that the beam seen from the wafer proceeds to the left as the wafer proceeds to the right of the page with the stage. The up and down direction on the page is the deflection direction. Also, the graph of the right of FIG. 8(a) typically shows the surface charge amount distribution within the stripe about immediately after the primary beam for surface charge control 203a is irradiated and about when 0.1 sec has passed from when the primary beam for surface charge control was irradiated.

Prior to that the primary beam for inspection 203b is irradiated within the stripe and the inspection is conducted, the primary beam for surface charge control 203a was irradiated within the same stripe and the surface charge control was conducted. In the embodiment 2, as the primary beam for surface charge control 203a is converged thinly on the wafer in the same way as the primary beam for inspection, immediately after the primary beam for surface charge control is irradiated, the surface charge amount distribution is a sharp distribution close to the rectangular distribution. However, the surface charge leaks from the end of the stripe while 0.1 sec passes from when the primary beam for surface charge control was irradiated. As the result, the surface charge amount is decreased to the 50% on the end of the stripe for the center of the stripe. Here, the surface charge amount after 0.1 sec is shown as an example, but it can be considered that as the decrease of the surface charge amount on the end part of the stripe like this occurs as the time passes, the surface charge has become not uniform within the stripe when the primary beam for inspection is irradiated and it results in the ununiformity of the brightness of the image and the inspection sensitivity in the center and on the end part of the image.

Figure 9:
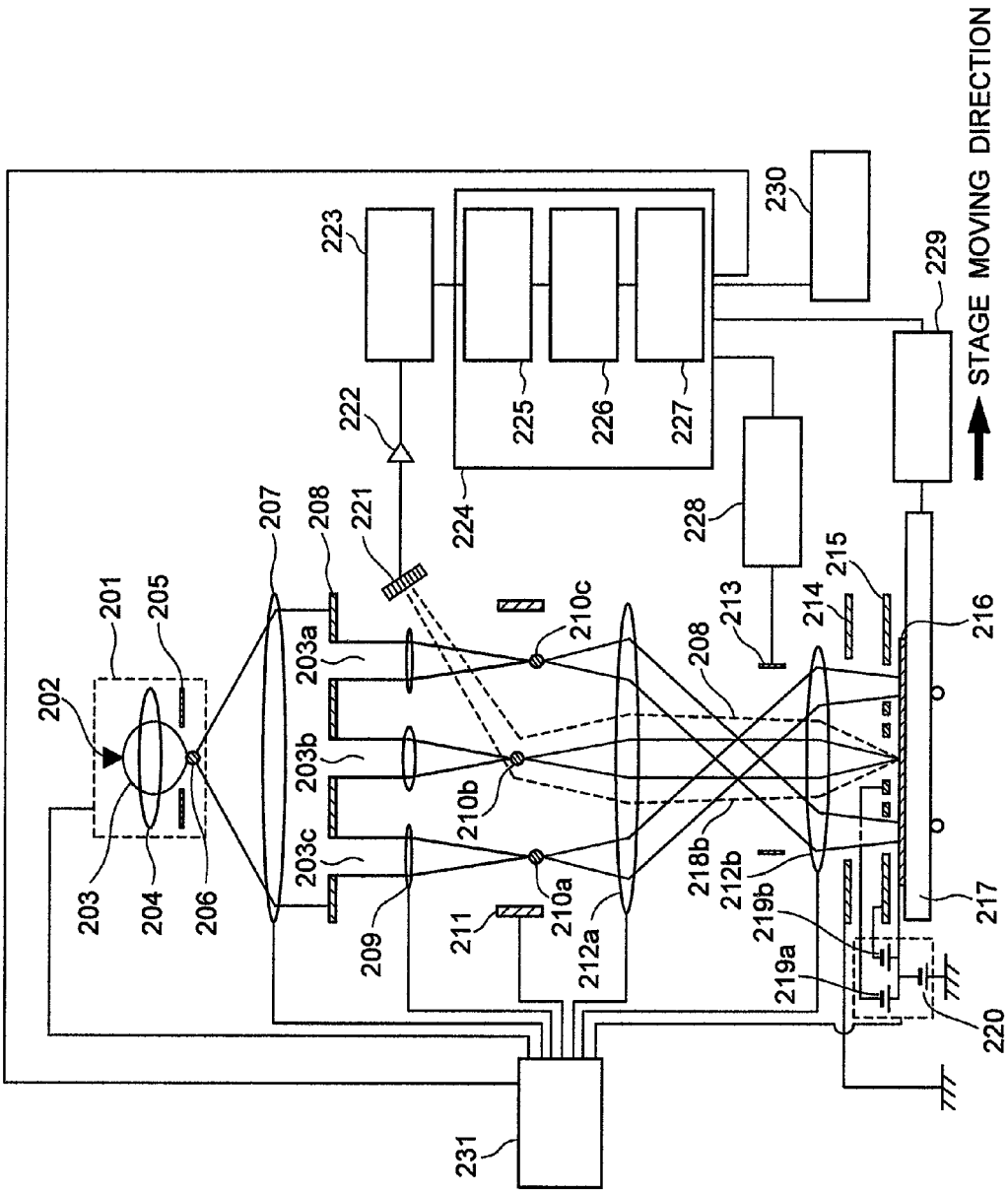
FIG. 9 is a schematic configuration diagram of the electron beam inspection apparatus of a fourth embodiment.

In order to solve this problem, in this embodiment, as a schematic configuration diagram shown in FIG. 9, the beam diameter of the primary beam for surface charge control on the wafer 216 surface is made to be bigger than the beam diameter of the primary beam for inspection by shifting the height of the focus position for the sample surface, namely the focus position in the vertical direction for the sample surface, between the primary beam for inspection and the primary beam for surface charge control. Namely, the focus distance of the lens array 209 is adjusted so that the second electron source images 210a, 210c of the primary beam for surface charge control are formed on the wafer side compared to the second electron source image 210b of the primary beam for inspection. For this reason, in this embodiment, the lenses of the lens array 209 are configured being separated in a lens for primary beam for inspection and lenses for primary beam for surface charge control, and it is also configured so that the lens conditions can be controlled individually. Thereby the object lenses 212a, 212b which are adjusted so that the primary beam for inspection 210b forms the image on the wafer 216 cannot make the primary beam for surface charge control form the image on the wafer 216, and the diameters of the primary beams for surface charge control 218a, 218c on the wafer 216 become bigger compared to the diameter of the primary beam for inspection 218b.

FIG. 8(b) is a conceptual diagram showing the movement of the beam seen from the wafer. Also, the graph of the right of FIG. 8(b) typically shows the surface charge amount distribution within the stripe about immediately after the primary beam for surface charge control 203a is irradiated and about when 0.1 sec has passed from when the primary beam for surface charge control was irradiated. Prior to that the primary beam for inspection 203b is irradiated within the stripe and the inspection is conducted, the primary beam for surface charge control 203a was irradiated within the same stripe and the surface charge control was conducted. In this embodiment, as the primary beam for surface charge control 203a which is irradiated within the stripe is not converged thinly on the wafer, the surface charge amount distribution becomes the smooth distribution immediately after the primary beam for surface charge control is irradiated. While 0.1 sec passes from when the primary beam for surface charge control was irradiated, the surface charge amount distribution becomes smoother because of the leak, but the surface charge amount on the end of the stripe is 78% for the center of the stripe and it can be said that the uniformity is improved compared to the surface charge amount distribution of the embodiment 1 shown in FIG. 8(a).

Figure 10:
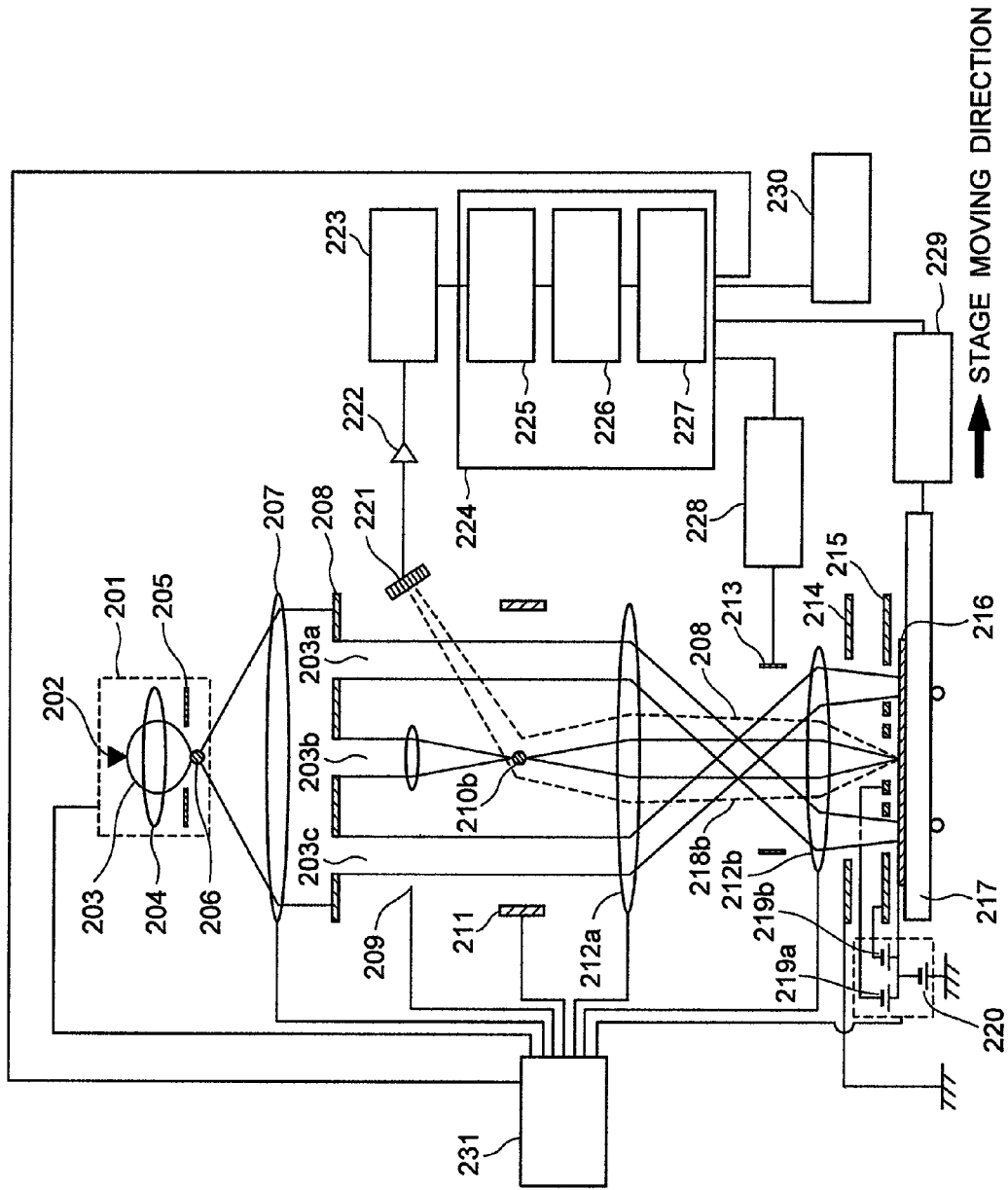
FIG. 10 is another example of configuration of the electron beam inspection apparatus of the fourth embodiment.

Here, in this embodiment, the focus distance of the lens array 209 is adjusted so that the second electron source images 210a, 210c of the primary beam for surface charge control are formed on the wafer side compared to the second electron source image 210b of the primary beam for inspection, but on the contrary to this, also when the focus distance of the lens array 209 is adjusted so that the second electron source images 210a, 210c of the primary beam for surface charge control are formed on the lens array side compared to the second electron source image 210b of the primary beam for inspection, the same effect can be obtained. Also, as shown in a schematic configuration of FIG. 10, there is also a case where the same effect can be obtained by making the lens array 209 substantially not affect the primary beams for surface charge control 203a and 203c. Further, even when the focus distances of the lens array 209 through which the primary beam for surface charge control and the primary beam for inspection pass are equal, there is also a case where the diameters of the primary beams for surface charge control 203a, 203c can be made to be bigger compared to the diameter of the primary beam for inspection 203b if the aberration of the curvature of field, etc. of the object lens, etc. is used.

Embodiment 5

Figure 11:
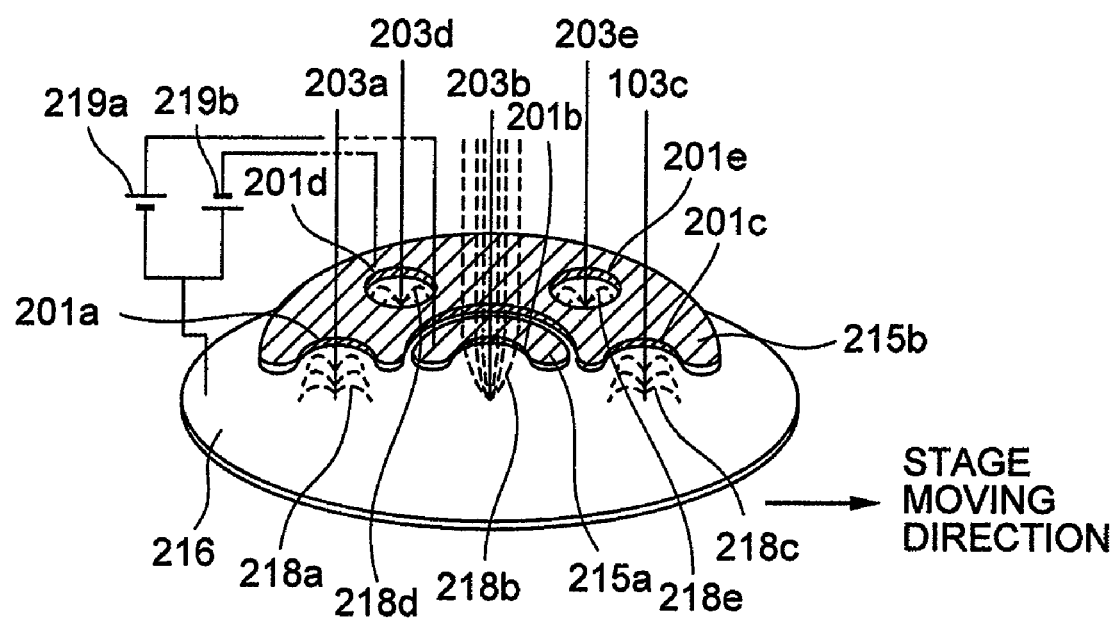
FIG. 11 is an enlarged diagram of the surface electric field control electrode and the wafer in the vicinity of the electron beam inspection apparatus of a fifth embodiment.

On the other hand, FIG. 11 is an enlarged diagram of a part including the surface electric field control electrode and the wafer of the embodiment in another embodiment of the electron beam inspection apparatus which has a more effective effect for the surface charge ununiformity. Also in FIG. 11, in the same way as FIG. 3, it is shown with the size of the surface electric field control electrode is relatively enlarged for the wafer. In FIG. 11, 203b is the primary beam for inspection and 203a and 203c are the primary beams for surface charge control which are irradiated on the wafer before and after of the moving direction of the stage for 203b respectively. On the other hand, 203d and 203e are also the primary beams for surface charge control, and they are irradiated in the stripe on the left side (for the moving direction of the stage) of the stripe being inspected. Also, though not shown, on the right side for the moving direction of the stage the primary beams for surface charge control 203f and 203g are provided. A conceptual diagram showing the movement of the primary beam for surface charge control and the primary beam for inspection seen from the wafer and the surface charge amount distribution within the stripe on this occasion are shown in FIG. 8(c). Prior to that the primary beam for inspection 203b is irradiated within the stripe and the inspection is conducted, the primary beam for surface charge control 203a was irradiated within the same stripe and the surface charge control was conducted. Also, the primary beams for surface charge control 203d and 203f are irradiated in the adjacent stripes respectively and conduct the surface charge control. The surface charge amount distribution immediately after that the primary beam for surface charge control was irradiated is a rectangular distribution which also covers the adjacent stripes. For this reason, even if the leak occurs while 0.1 sec passes from when the primary beam for surface charge control was irradiated, the decrease of the surface charge amount does not occur about the stripe being inspected. Therefore, the surface charge amount on the end of the stripe for the center of the stripe is 100%. As the result, the ununiformity of the brightness of the image and the detection sensitivity caused by the surface charge ununiformity are greatly reduced.

Embodiment 6

In the embodiment 2, the primary beam is split into three beams using the aperture array and two are used for surface charge control and one is for inspection. On this occasion, the surface electric field strength in the area where the two primary beams for surface charge control are to be irradiated on the wafer are set to be equal. However, in this embodiment, there is a case where the brightness of the image and the detection sensitivity does not become uniform within the stripe.

Figure 12:
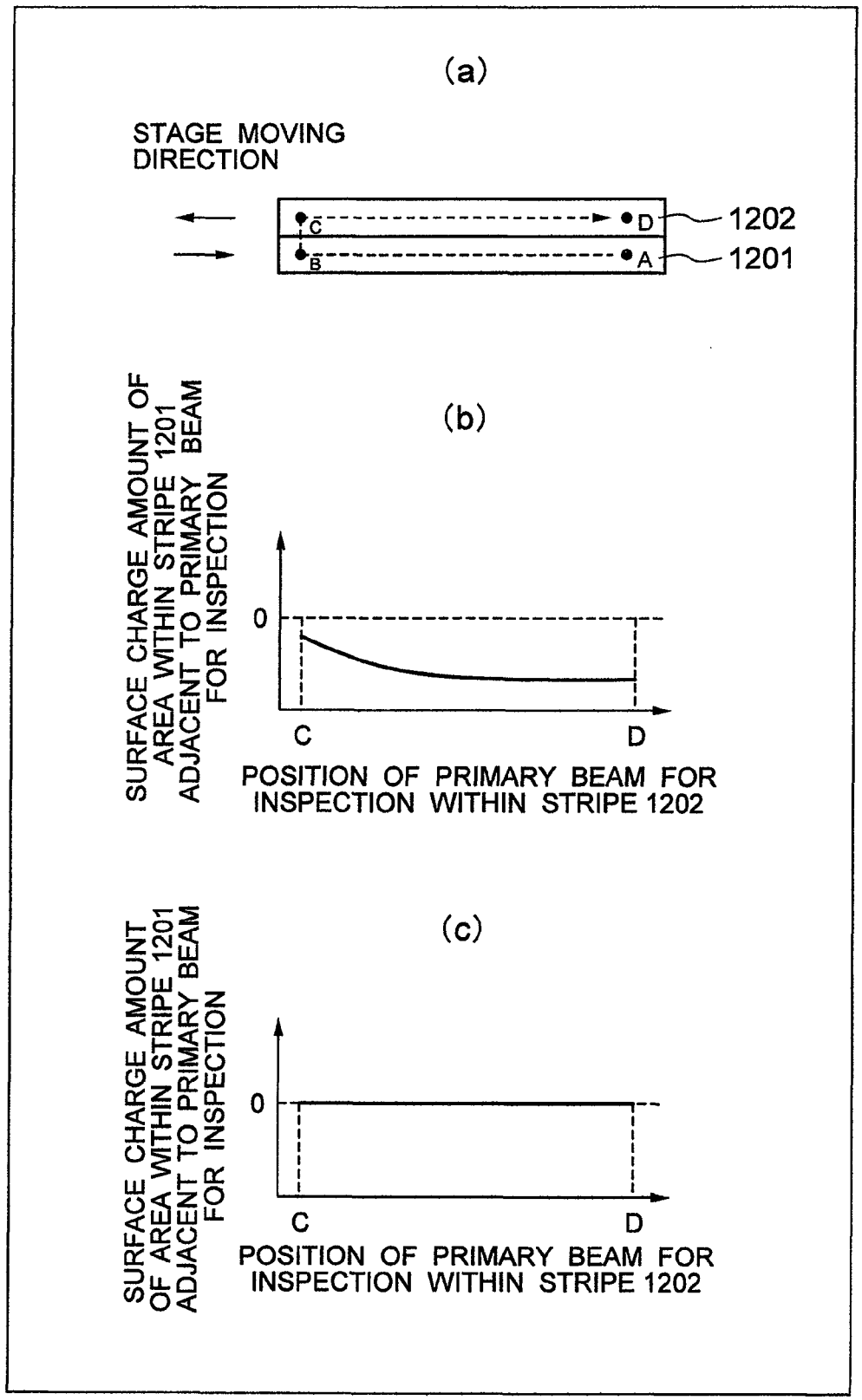
FIG. 12 is a diagram showing the distribution of the surface charge amount in a sixth embodiment.

As one of the causes, the ununiformity of the surface charge amount can be thought of. It will be explained using FIG. 12. FIG. 12(a) is a typical diagram showing the order of the inspections, and two stripes are sampled from among the areas to be inspected on the wafer. The order of the inspection is in order of stripe 1201 and stripe 1202. The moving direction of the stage is in the right direction about the stripe 1201 and in the left direction about the stripe 1202. Therefore, the inspection will be conducted in order of A point, B point, C point, D point as shown by the dotted line arrow.

The surface charge within the stripe changes as the following. In the inspection of the stripe 1201, the primary beam for surface charge control 203a, the primary beam for inspection 203b, the primary beam for surface charge control 203c are irradiated from the A point to the B point in order. As shown in FIG. 2, in the embodiment 2, the surface electric field strength of the area where the primary beams for surface charge control 203a and 203c are irradiated is controlled by the section of the electrode 215b of the single surface potential control electrode. For this reason, for example when the wafer is negatively surface charged using the primary beam for surface charge control 203a, after being inspected by the primary beam for inspection 203b, the wafer is negatively surface charged again by the irradiation of the primary beam for surface charge control 203c. This surface charge is gradually attenuated. The rate of the attenuation is determined by the surface charge amount and the surface resistance of the wafer, etc.

When the inspection of the stripe 1201 is terminated, the moving direction of the stage is inverted and the inspection is conducted from the C point to the D point of the adjacent stripe 1202 in order. On this occasion, for example if the stripe 1201 is remarkably surface charged, it sometimes happens that the electric field formed by the surface charge obstacles the track of the primary beam for inspection 203b. Also, as the surface charge leaks between the adjacent stripes, it also sometimes happens that the surface charge amount of the inspection area changes. In this way, sometimes the surface charge condition of the area adjacent to the primary beam for inspection affects the inspection sensitivity.

Then, in the case where the inspection of the stripe 1202 is conducted in the order shown in FIG. 12(a), the C point and the D point are compared in respect to the surface charge amount of the area within the stripe 1201 adjacent to the primary beam for inspection. The time which passes from when the B point of the stripe 1201 is negatively surface charged by the primary beam for surface charge control 203c to when the inspection of the C point is conducted is longer compared to the time which passes from when the A point of the stripe 1201 is negatively surface charged by the primary beam for surface charge control 203c to when the inspection of the D point is conducted. For this reason, taking in consideration the attenuation of the surface charge, as shown in the graph showing the distribution of the surface charge amount of FIG. 12(b), the surface charge amount of the area within the stripe 1201 adjacent to the primary beam for inspection differs at the C point and at the D point. In FIG. 12(b), the horizontal axis is the position of the primary beam for inspection within the stripe 1202 and the vertical axis is the surface charge amount of the area within the stripe 1201 adjacent to the primary beam for inspection. This is considered to be the cause of the ununiformity of the brightness of the image and the inspection sensitivity within the stripe.

Figure 13:
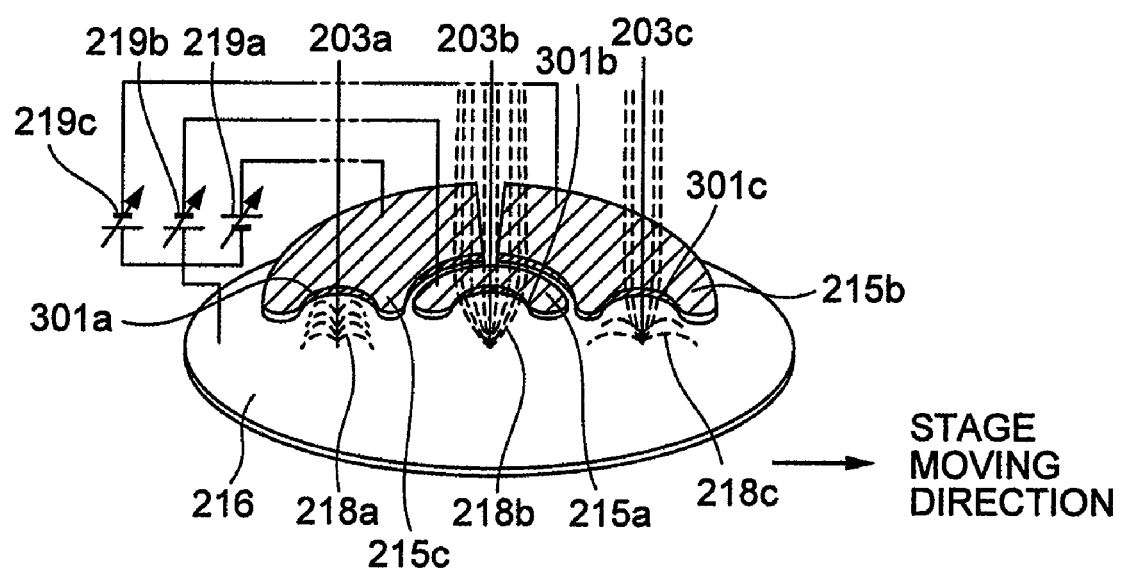
FIG. 13 is an enlarged diagram of the surface electric field control electrode and the wafer in the vicinity of the electron beam inspection apparatus of the sixth embodiment of the present invention.

In this embodiment, this problem is solved by splitting the surface electric field control electrode into three. FIG. 13 is an enlarged diagram of a part including the surface electric field control electrode and the wafer in an electron beam inspection apparatus in this embodiment. Also in FIG. 13, in the same way as FIG. 3, it is shown with the size of the surface electric field control electrode relatively more enlarged compared to the wafer. The surface electric field control electrode is split into three sections of the electrode 215a, 215b, 215c and they are given the potential individually by the surface electric field control power supplies 219a, 219b, 219c.

When the inspection of the stripes 1201 and 1202 is conducted using this configuration, the surface charge within the stripe changes as the following. In the inspection of the stripe 1201, the primary beam for surface charge control 203a, the primary beam for inspection 203b, the primary beam for surface charge control 203c are irradiated from the A point to the B point in order. The surface electric field strength of the areas where the primary beams for surface charge control 203a and 203c are irradiated is individually controlled. For this reason, for example, even when the secondary charged particle 218a is pulled back to the wafer 216 and the wafer 216 is negatively surface charged using the primary beam for surface charge control 203a, after the wafer is inspected by the primary beam for inspection 203b, it is possible to adjust the pulled back amount of a secondary charged particle 218c to the wafer 216 by the primary beam for surface charge control 203c and to control the surface charge amount of the wafer 216 to the desired value. Therefore, when the inspection of the stripe 1201 is terminated and the inspection is to be conducted from the C point to the D point of the adjacent stripe 1202 in order, the surface charge amount of the adjacent stripe 1201 can be made to be uniformly zero as shown in FIG. 12(c). Thereby the brightness of the image and the inspection sensitivity within the stripe can be maintained uniformly.

Here, on the occasion of the inspection of the stripe 1202, it is possible to negatively surface charge the wafer using the primary beam for surface charge control 203c and to remove the surface charge of the wafer by the primary beam for surface charge control 203a after conducting the inspection by the primary beam for inspection 203b by exchanging the voltages to be applied to the sections of the electrode 215b and 215c of the surface electric field control electrode. Thereby it is possible to make the surface charge amount after the inspection uniform also with respect to the stripe 1202.

Embodiment 7

In the embodiments 1 to 6, in the electron beam inspection apparatus of single beam type provided with one primary beam for inspection, by forming also the primary beam for surface charge control using the electron source which generates the primary beam for inspection, the primary beam for surface charge control is irradiated in the position spatially close to the primary beam for inspection on the wafer, the surface charge of the wafer by the irradiation of the primary beam for surface charge control is sufficiently maintained to the inspection by the primary beam for inspection, and thereby the image with a high contrast is formed and the preciseness of the defect detection is improved. On the other hand, in this embodiment, it is configured that a plurality of beams for inspection and for surface charge control are pulled out from one electron source in the same way as the embodiments 1 to 6, but among these beams a plurality of beams are used as the beam for inspection instead of one. Thereby, as a plurality of inspections can be conducted at the same time in parallel, the throughput can be improved. On the other hand, in the embodiments 1 to 6, as the inspection beam is one, in the point of view of separating the secondary charged particle it is only necessary to be able to separate the two kinds of electrons which have greatly different conditions of the secondary charged particle by the inspection beam and the secondary charged particle by the beam for surface charge control, but in this embodiment as there are a plurality of inspection beams, a new problem arises that it is necessary to control so that the plurality of secondary charged particles by the plurality of inspection beams which are controlled under the same condition are in the condition in which they do not get mixed with each other and separate and detect them.

Conventionally, in the electron beam inspection apparatus of multi beam type which was proposed to improve the throughput, at the same time as inspecting with the plurality of beams for inspection, it was necessary to control also the surface charge of the sample by the beam for inspection itself. Therefore, it was necessary to separate and detect the plurality of secondary charged particles emitted from a plurality of places on the sample by that the plurality of beams are irradiated. Further, it was also necessary to control the track of the secondary electron generated from the sample using the electrode facing the sample in order to control the surface charged state by the primary beam for inspection itself. As the result, there was a case where it was difficult to separate and detect the plurality of secondary charged particles. In particular, when an electric field to pull back the secondary electron with low energy to the sample is generated, as the track of the secondary electron with high energy to be detected not being pulled back to the sample also is greatly disturbed, the secondary charged particles generated from the plurality of places on the sample get mixed with each other and it becomes difficult to separate and detect them. Namely, it is difficult to achieve both of the surface charge control method using the plurality of primary beams for inspection and the separation and detection of the secondary electron with the conventional method. Here, in the electron beam inspection apparatus of multi beam type, it is possible to irradiate the electron beam with a unit such as a flood gun, etc. provided separately from the beam optical system and control the surface charge without controlling the surface charge by the inspection beam itself. However, in this case, there is a problem that it takes time from the preliminary irradiation to the irradiation of the beam for inspection and it cannot be controlled to the desired surface charged state as it has been explained regarding the conventional technique. In the present invention, this problem also is solved by using a part of the multi beam for surface charge control.

On the other hand, in the same way as the embodiments 1 to 6, according to this embodiment which pulls out the primary beam for surface charge control from the same electron source as the electron source which generates the primary beam for inspection and controls the surface charge of the sample using this, about the secondary charged particle generated by the primary beam for inspection, it becomes possible to control it with the condition appropriate for the separation and detection, namely the condition to pull back the secondary electron to the electron gun direction. Thereby it becomes possible to pull out the secondary electrons from the plurality of places of the sample accelerating them and to pullout them to the electron gun side still in the condition in which they do not get mixed with each other and locally exist. Therefore, it becomes possible to separate and detect the secondary electrons by the plurality of primary beams for inspection by a method and a configuration described later. Thereby it is possible to form the image with a high contrast and to improve the preciseness of the defect detection achieving the higher throughput by effectively utilizing the plurality of primary beams for inspection and achieving both of the control of the surface charge and the separation and detection of the secondary charged particles.

Figure 14:
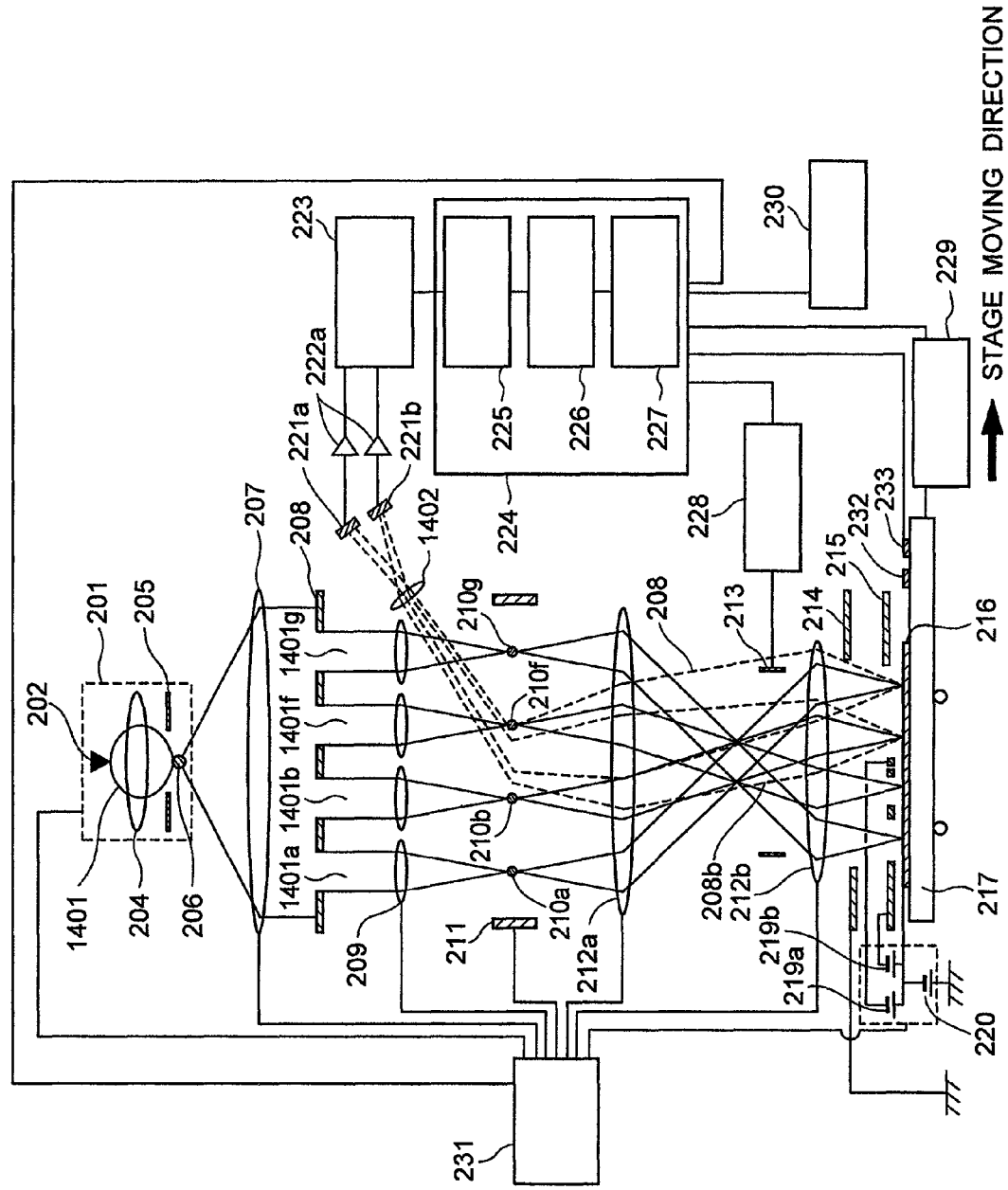
FIG. 14 is a schematic configuration diagram of the electron beam inspection apparatus of a seventh embodiment of the present invention.

FIG. 14 is a schematic diagram of an electron beam inspection apparatus of multi beam type in this embodiment. In this embodiment, ten primary beams are formed by the inspection apparatus of the almost same configuration as the embodiment 2. However, in order to form the ten beams, five primary beams for inspection 1401a, 1401b, 1401c, 1401d, 1401e and five primary beams for surface charge control 1401f, 1401g, 1401h, 1401i, 1401j are formed by the aperture array 208 provided with ten apertures and the lens array 209 which forms at least ten eintzel lenses. Here, in order to simplify the diagram, in FIG. 14, among the five primary beams for inspection only 1401a and 1401b, and among the five primary beams for surface charge control only 1401f and 1401g are shown.

Figure 15:
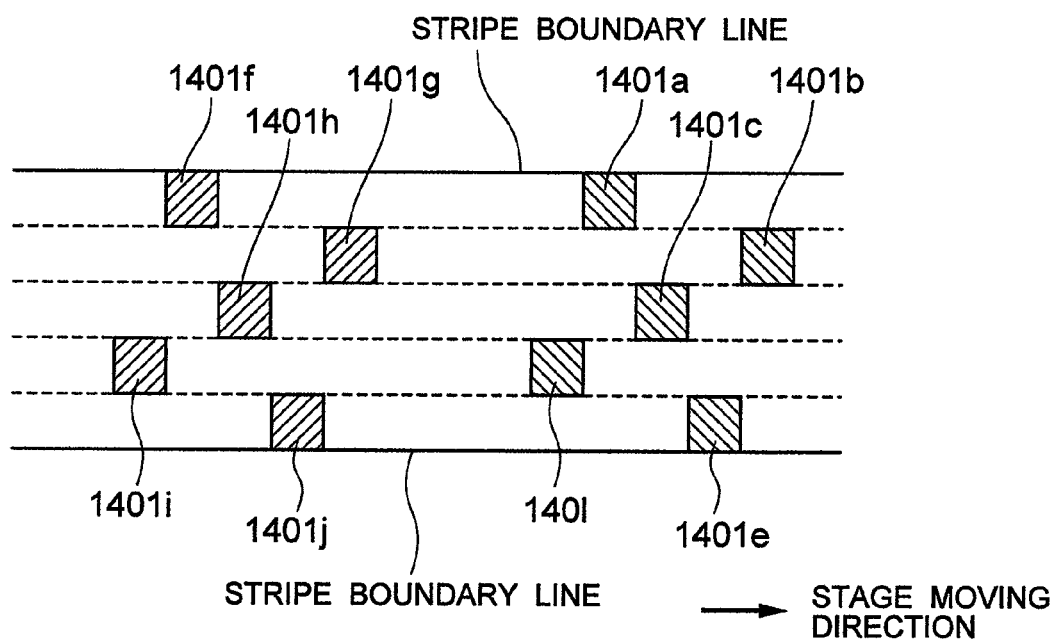
FIG. 15 is a conceptual diagram explaining the raster scanning in the seventh embodiment.

The ten primary beams receive the deflection effect only in the almost same direction and in the almost same angle and raster scans on the wafer 216 which is the sample. FIG. 15 is a conceptual diagram explaining the raster scanning in this embodiment. The exposure areas of the five primary beams for inspection 1401a, 1401b, 1401c, 1401d, 1401e and the five primary beams for surface charge control 1401f, 1401g, 1401h, 1401i, 1401j raster scan within the stripe by the raster scanning. It is possible to raster scan within the stripe thoroughly with the movement of the stage by raster scanning the primary beams for inspection 1401a, 1401b, 1401c, 1401d, 1401e arranged at the equal interval when being projected on the axis perpendicular to the moving direction of the stage. On the other hand, prior to the primary beams for inspection, the primary beams for surface charge control 1401f, 1401g, 1401h, 1401i, 1401j raster scan within the stripe and control the surface charged state.

Figure 16:
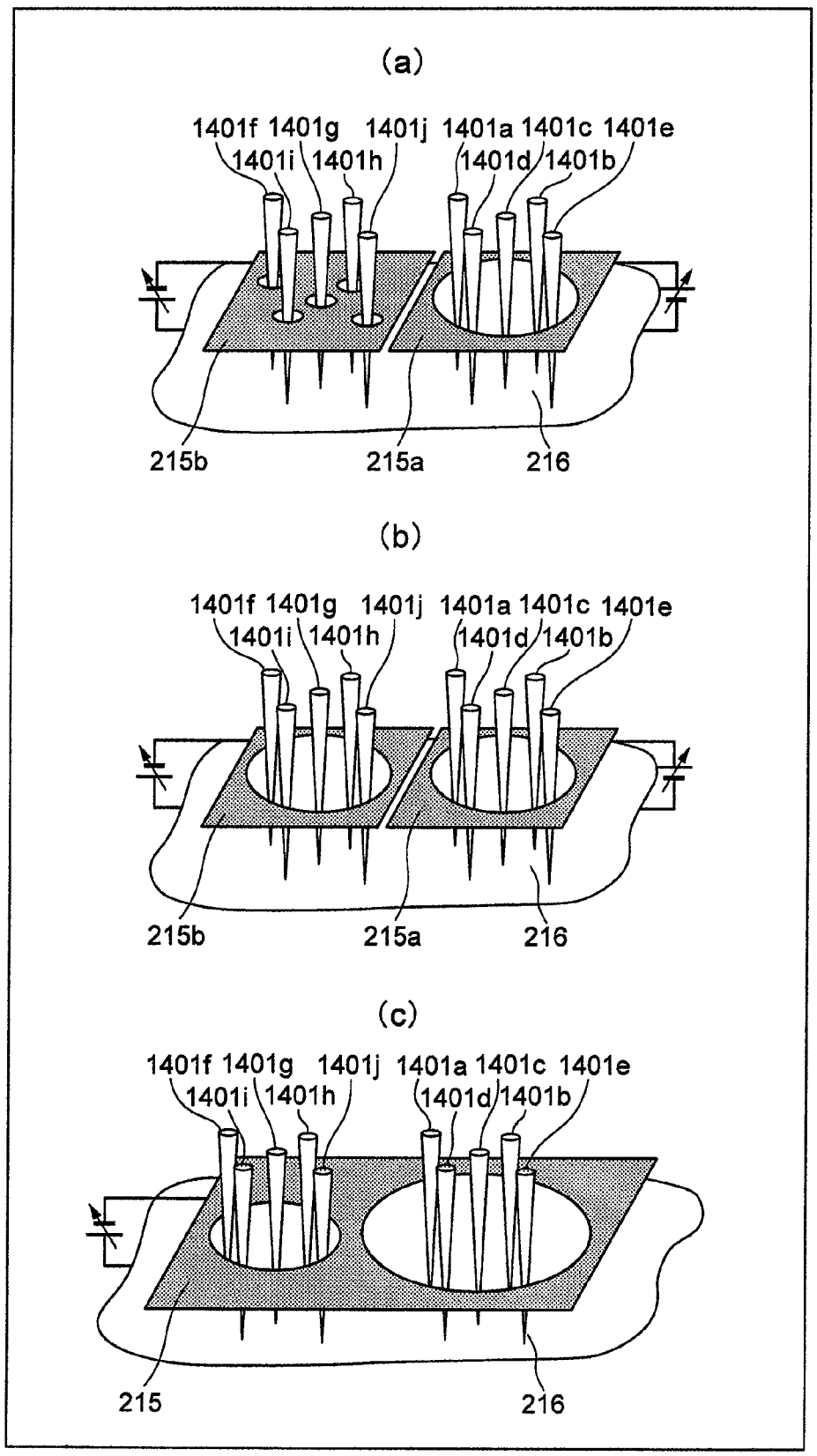
FIG. 16 is an enlarged diagram of a part including the surface electric field control electrode and the wafer in the electron beam inspection apparatus of the seventh embodiment (FIG. 15).

FIG. 16(a) is an enlarged diagram of a part including the surface electric field control electrode 215 and the wafer 216 in this embodiment. The surface electric field control electrode 215 is electrically separated into two sections of the electrode 215a and 215b. Each of the sections of the electrode is individually given the potential difference for the wafer 216 by the different power supplies. In the section of the electrode 215a a single throughhole through which the five primary beams for inspection 1401a, 1401b, 1401c, 1401d, 1401e pass is provided. On the other hand, in the section of the electrode 215b five throughholes through which the primary beams for surface charge control 1401f, 1401g, 1401h, 1401i, 1401j pass respectively are provided. The surface electric field strength of the area where each beam is irradiated is determined by the size of the throughhole and the voltage to be applied to the section of the electrode 215a or 215b. On the other hand, there is also a case where the same effect can be obtained even when a throughhole through which the primary beams for surface charge control 1401f, 1401g, 1401h, 1401i, 1401j commonly pass is provided as shown in FIG. 16(b). Further, there is also a case where the same effect can be obtained without electrically separating the surface electric field control electrode as shown in FIG. 16(c). Namely, in a single surface electric field control electrode 215 a throughhole through which the five primary beams for inspection 1401a, 1401b, 1401c, 1401d, 1401e pass and a throughhole through which the five primary beams for surface charge control 1401f, 1401g, 1401h, 1401i, 1401j pass are provided respectively, and by making the diameters of these two throughholes different, the surface electric field strength of the area where the primary beam for inspection is irradiated and the area where the primary beam for surface charge control is irradiated can be changed.

Next, the detection method of the five primary beams for inspection 1401a, 1401b, 1401c, 1401d, 1401e will be explained using FIG. 14. In order to simplify the diagram, in FIG. 14 among the five secondary charged particles only the secondary charged particle 208a generated by the irradiation of the primary beam 1401a and the secondary charged particle 208b generated by the irradiation of the primary beam 1401b are shown.

Also in this embodiment, in the same way as the embodiment 2, the negative potential to decrease the rate of the primary beam is applied to the wafer 216. Thereby the secondary charged particles 208a and 208b are accelerated in the direction getting farther from the sample and after receiving the convergence effect of the object lens 212a and 212b, they are separated from the track of the primary beam by the Wien filter 211. Further, the secondary charged particles get their tracks bended in the different directions respectively by the convergence effect of the lens for secondary charged particle convergence 1402 provided in the front stage of the detector and are separated and detected by the detectors 221a and 221b. Here, in order to separate and detect the secondary electron by the plurality of inspection beams, basically it is sufficient to be configured having the acceleration of the secondary electron in the electron gun direction and the deflection by the Wien filter, and a plurality of detectors arranged in the appropriate positions. However, in practice, if it is configured only with these, the positions where the secondary charged particles reach become close to each other, and the problems such that the appropriate arrangement of the detectors are difficult, that the rightness for the change of the optical condition is insufficient, and substantially the sufficient separation and detection cannot be accomplished. Then, in this embodiment, in order to obtain greater separation effect by aggressively making the positions of the secondary charged particles greatly apart from each other, a secondary electron convergence lens is further provided. Thereby an effect can be obtained that the appropriate arrangement of the detectors become easier and the rightness for the change of the optical condition can be kept.

Embodiment 8

Figure 17:
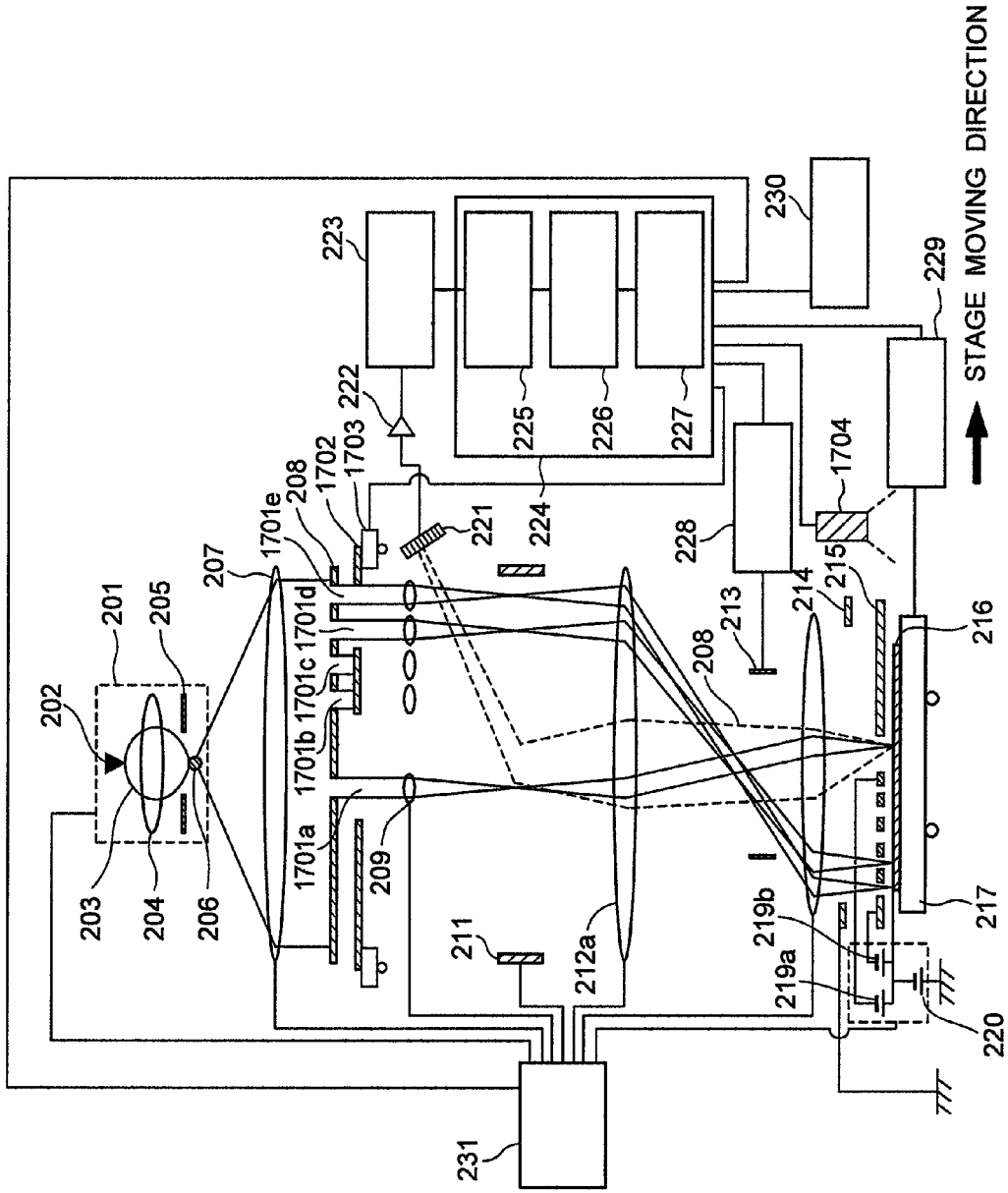
FIG. 17 is a schematic diagram of the electron beam inspection apparatus of multi beam type explaining an eighth embodiment.

FIG. 17 is a diagram showing a schematic configuration of an electron beam inspection apparatus according to an eighth embodiment. This embodiment is an inspection apparatus using a plurality of primary beams for inspection and primary beams for surface charge control, in which it becomes possible to irradiate the desired beam by newly being provided with a beam selection mask and a beam selection stage. As the electron gun part 201 and the condenser lens 207 are as the same as the embodiments 2 and 7, their explanations will be omitted. Here, in this embodiment, apart from the configuration to separate the plurality of primary electron beams for inspection and for surface charge control from one electron source and irradiate them on the sample, a flood gun 1704 which is provided with separate electron source and irradiates the beam on the sample is installed. This flood gun 1704 is installed with the object to control the surface charge of the sample separately from the primary beam for surface charge control. The operation of the flood gun will be described later.

In this embodiment, the primary beam 203 is split into 20 primary beams by installing the aperture array 208 in which the apertures are arranged in two dimensions on the same substrate. Among these, four are the primary beams for inspection and 16 are the primary beams for surface charge control. Namely, for the area where one primary beam for inspection is irradiated, four primary beams for surface charge control conduct the surface charge control. In FIG. 17, in order to simplify, among the four primary beams for inspection only one beam is shown by the sign of 1701a. Also, among the 16 primary beams for surface charge control only four beams corresponding to 1701a are shown by the signs of 1701b, 1701c, 1701d, 1701e. 1702 is a beam selection mask and it has a plurality of apertures of pattern. Namely, on the beam selection mask 1702, different aperture patterns of the number of the combinations of the beams to be selected are formed. A beam selection stage 1703 moves by the control of the system control part 224 and cuts off only the desired beams among the 20 primary beams using the desired aperture patterns among the aperture patterns provided on the beam selection mask 1702.

Figure 18:
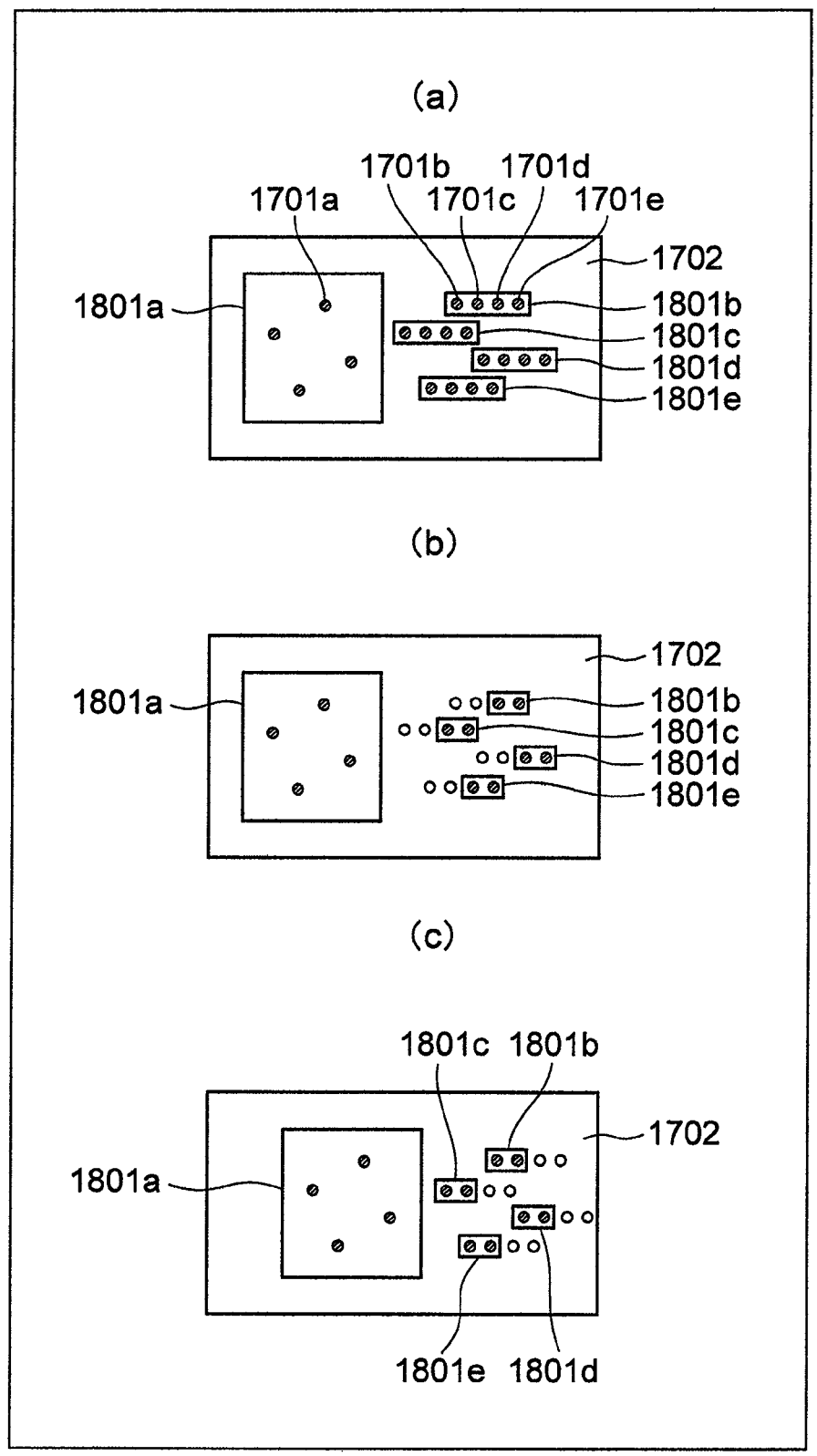
FIG. 18 is a typical diagram showing the relationship between the primary beams and apertures of a beam selection mask in the eighth embodiment.

FIG. 18 is a typical diagram showing the relationship between the primary beams and the apertures of the beam selection mask. Among the primary beams shown by the diagonal lines the left four are the primary beams for inspection and the remaining 16 are the primary beams for surface charge control. For one primary beam for inspection four primary beams for surface charge control are arranged. Namely, for the primary beam for inspection 1701a the primary beams for surface charge control 1701b, 1701c, 1701d, 1701e are arranged.

In FIG. 18(a), the beam selection mask 1702 passes all of the 20 primary beams. Namely, four primary beams for inspection pass through an aperture for the primary beam for inspection 1801a and four primary beams for surface charge control pass through apertures for the primary beam for surface charge control 1801b, 1801c, 1801d, 1801e respectively. On the other hand, in FIG. 18(b), the beam selection mask 1702 passes 12 beams among the 20 primary beams. Namely, it passes the four primary beams for inspection and the eight primary beams for surface charge control. In FIG. 18(c) also, the beam selection mask 1702 passes the four primary beams for inspection and the eight primary beams for surface charge control. However, the beams to be passed are different in FIGS. 18(b) and (c). Namely, in FIG. 18(b), among the primary beams for surface charge control 1701b, 1701c, 1701d, 1701e the primary beams for surface charge control 1701d and 1701e which are far from the primary beam for inspection 1701a are passed, but on the contrary to this, in FIG. 18(c), among the primary beams for surface charge control 1701b, 1701c, 1701d, 1701e the primary beams for surface charge control 1701b and 1701c which are close to the primary beam for inspection 1701a are passed. About the effect obtained by changing the number or the position of the primary beams for surface charge control to be passed in this way will be described later.

The primary beams which passed through the beam selection mask 1702, after being individually converged by the lens array 209, are projected in scale-down on the wafer 216 by the object lenses 212a and 212b. To the wafer 216 the negative potential is applied by the retarding power supply 220. Therefore, the electric field to decrease the rate of the primary beam is formed between this and the ground electrode 214 connected to the ground potential. 215 is the surface electric field control electrode and the surface electric field control power supplies 219a, 219b are the power supplies connected to the surface electric field control electrode 215.

Figure 19:
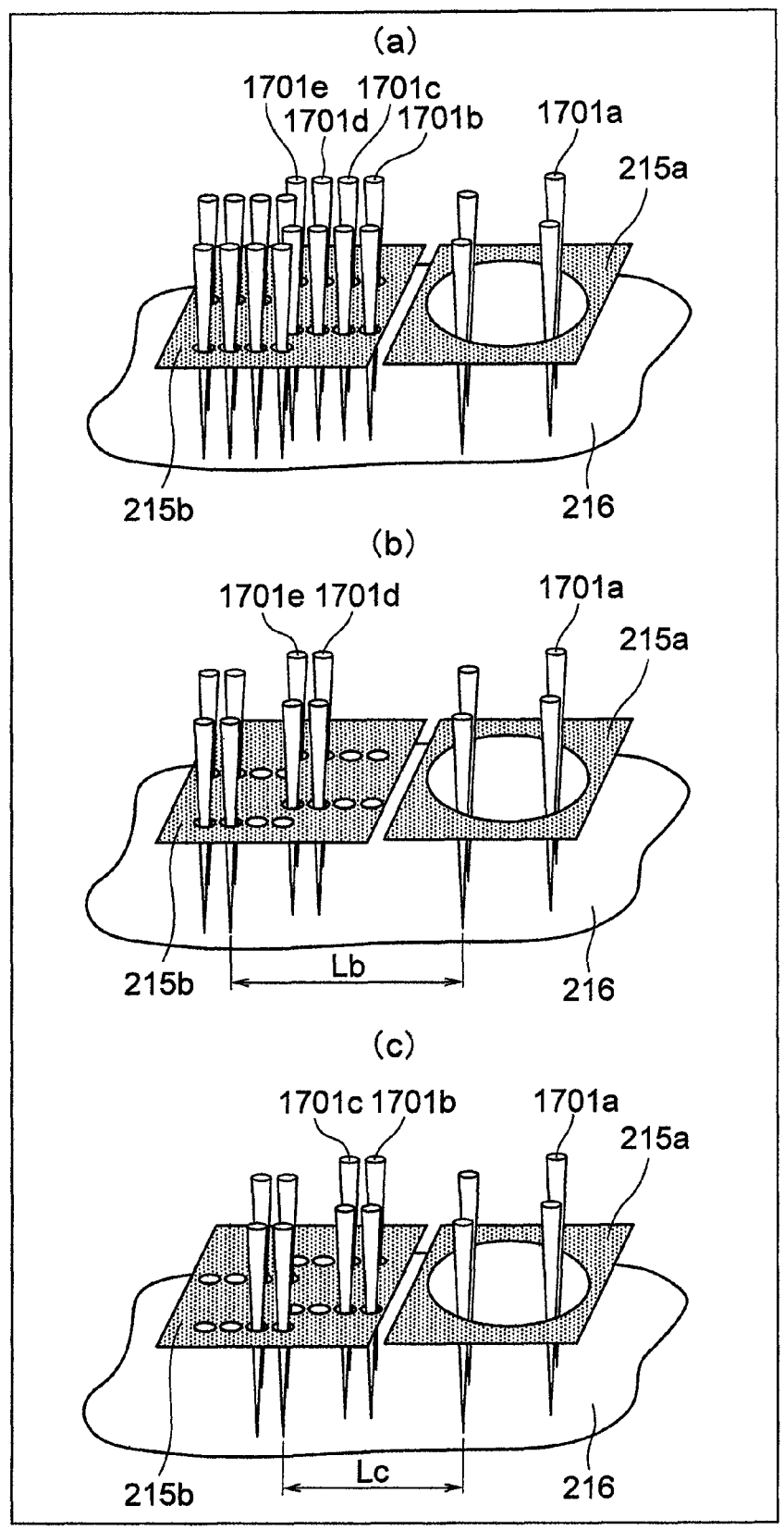
FIG. 19 is an enlarged diagram of a part including the surface electric field control electrode and the wafer in the eighth embodiment.

FIG. 19 is an enlarged diagram of a part including the surface electric field control electrode 215 and the wafer 216 in the electron beam inspection apparatus of FIG. 17. In this embodiment, one aperture to pass the primary beam for inspection and 16 apertures to pass the primary beams for surface charge control are provided in one piece of surface electric field control electrode. FIG. 19(a) is a diagram corresponding to FIG. 18(a) showing that all of the four primary beams for inspection and the 16 primary beams for surface charge control pass through the beam selection mask 1702 and are irradiated on the wafer 216. Assuming that the current of the primary beam for surface charge control is about 500 nA per one beam, the current of the primary beams for surface charge control which conduct the surface charge control of the area where one primary beam for inspection is irradiated will be 2 mA.

On the other hand, FIG. 19(b) is a diagram corresponding to FIG. 18(b) showing that among the four primary beams for surface charge control which conduct the surface charge control of the area where one primary beam for inspection is irradiated, two of them which are far from the primary beam for inspection pass through the beam selection mask 1702 and are irradiated on the wafer 216. Therefore, the current of the primary beams for surface charge control which conduct the surface charge control of the area where one primary beam for inspection is irradiated is 1 mA which is the half of FIG. 19(a). On the other hand, the distance between the primary beam for inspection and the primary beam for surface charge control is Lb. Therefore, assuming the stage rate to be v, the time interval from when the primary beam for surface charge control is irradiated to when the inspection is conducted by the primary beam for inspection, namely the interval Tb, is expressed by Lb/v. It is needless to say that the interval Tb can be changed by changing the stage rate v from this expression, but in many cases the stage rate v is determined by other causes, namely by the conditions such as the timing of the image formation of the beam for inspection, the area of the exposure area, etc. However, in this embodiment, it is possible to control the interval time from other than the stage rate as described below. The above-mentioned control is conducted by the system control part 224.

FIG. 19(c) is a diagram corresponding to FIG. 18(c) showing that among the four primary beams for surface charge control which conduct the surface charge control of the area where one primary beam for inspection is irradiated, two of them which are close to the primary beam for inspection pass through the beam selection mask 1702 and are irradiated on the wafer 216. Therefore, the current of the primary beams for surface charge control which conduct the surface charge control of the area where one primary beam for inspection is irradiated is 1 mA the same as FIG. 19(b), but the distance between the primary beam for inspection and the primary beam for surface charge control is Lc which is shorter than Lb. Therefore, assuming the stage rate to be v, the interval from when the primary beam for surface charge control is irradiated to when the inspection is conducted by the primary beam for inspection is Lc/v and Tb>Tc.

Figure 20:
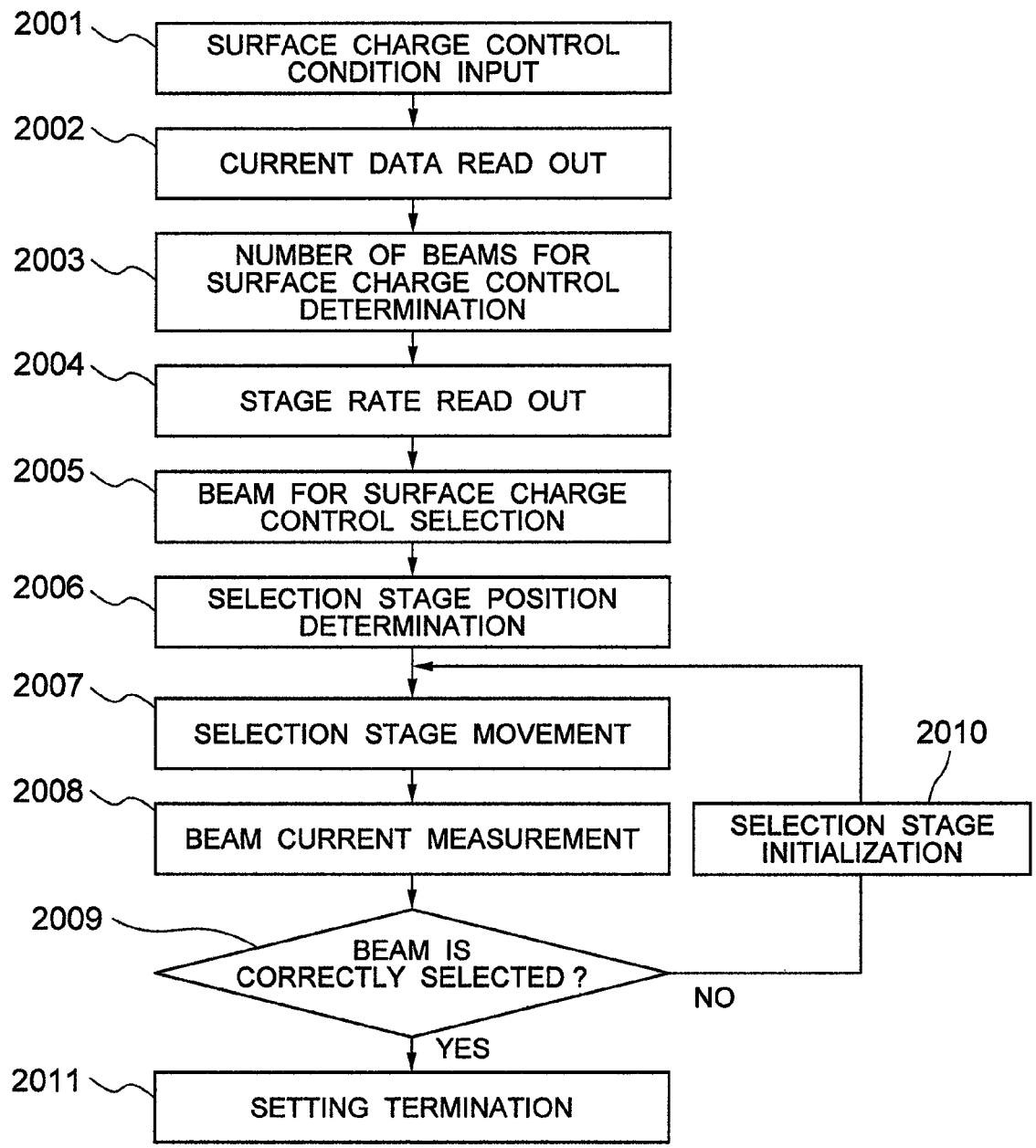
FIG. 20 is a flow chart showing selection procedures of the primary beam for surface charge control in the eighth embodiment.
Figure 21:
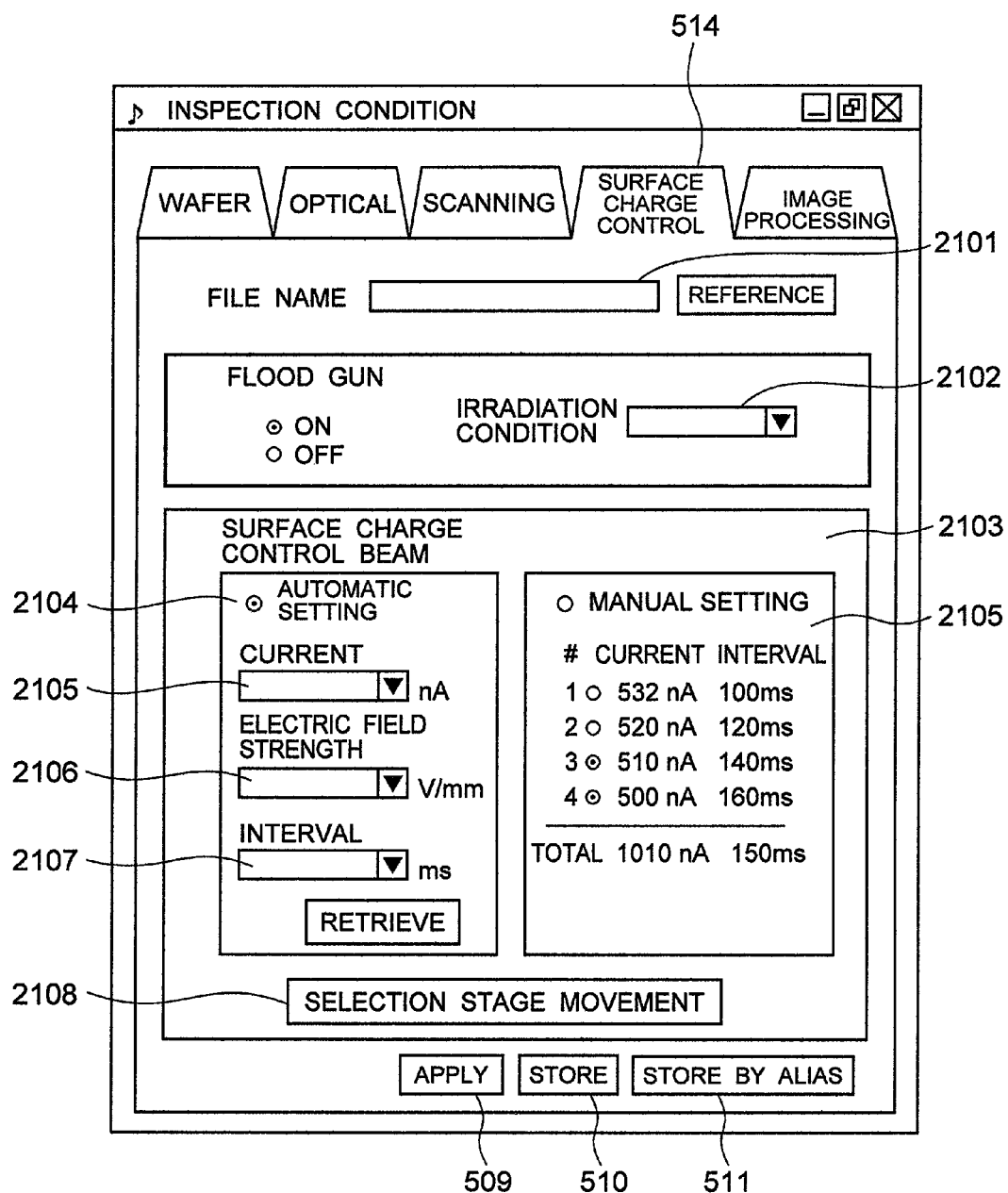
FIG. 21 is an inspection condition setting screen in the eighth embodiment.

In this way, it is possible to control the current of the primary beam for surface charge control and the time from when the primary beam for surface charge control is irradiated to when the inspection is conducted by the primary beam for inspection by selecting the primary beams for surface charge control using the beam selection mask 1702. Therefore, the inspections with conditions changed depending on the quality of the material and the thickness of the film of the wafer surface, the resistance of the wafer, etc. become possible. Next, the procedure to select the primary beams for surface charge control in this embodiment will be explained using FIGS. 20, 21. This procedure corresponds to the part setting the surface charge control conditions in the detection condition input (409 of FIG. 4) in the flow of the entire detection (for example, the detection procedure flow (FIG. 4) of the embodiment 2). As the procedures other than this are the same as the detection flow of other embodiments, their explanations will be omitted. FIG. 20 is a flow chart showing the procedure and FIG. 21 is a screen displayed by clicking the surface charge control condition indication tab 513 in the detection condition setting screen of FIG. 5. The operator inputs the surface charge control conditions using this screen (step 2001). The operator reads out the surface charge control condition file which has already been created through a file setting box 2101 or directly inputs the surface charge control condition through a flood gun irradiation condition setting part 2102 and a surface charge control beam setting part 2103. In the flood gun irradiation condition setting part 2102, the irradiation condition of the flood gun 1704 in FIG. 17 is determined. The operator selects whether or not to irradiate the wafer 216 using the flood gun 1704 after the loading of the wafer and prior to the inspection by a radio button of ON or OFF, further, when the wafer is to be irradiated, the operator inputs the enter energy, the position, the irradiation intensity, etc. of the beam to be irradiated on the wafer 216 from the flood gun. In the surface charge control beam setting part 2103, the operator inputs the condition to select the primary beams for surface charge control. A field for automatic setting 2104 and a field for manual setting 2105 are provided.

First, it will be explained the case where the operator selects the automatic setting field by the radio button. When the operator inputs a current setting box 2105 and an interval setting box 2107, the system control part 224 reads out the rate of the stage (step 2004) and selects the combination of the primary beams for surface charge control to be the closest to the condition which the operator has input after calculating the time interval (the interval) between each of the primary beams for surface charge control and the primary beam for inspection from the distance between each of the primary beams for surface charge control and the primary beam for inspection (step 2005). Then, the optimum position of the selection stage is determined based on the information of the position and form of the apertures provided on the selection stage (step 2006). When the operator clicks the selected stage move button 2108, the beam selection stage 1703 receives the signal from the system control part 224 and moves, to pass only the desired primary beams onto the wafer (step 2007).

Next, the current of the primary beam for inspection and the primary beam for surface charge control which is to reach onto the wafer is measured using the Faraday cup (not shown) provided on the stage (step 2008). When it is determined that the current is insufficient (step 2009), the beam selection stage is initialized (step 2010) because there is a possibility that the beam selection stage is not moving correctly, and the process returns to the step 2007 again. Or, the adjustment of the alignment of the primary beam is conducted by the aligner (not shown). When it is determined that the current is sufficient at the step 2009, the selection of the primary beams for surface charge control is terminated.

Here, an electric field strength setting box 2106 is a box to set the surface electric field strength of the area where the primary beam for surface charge control is irradiated, and the voltage to be applied to the section of the electrode 215b of the surface electric field control electrode is determined based on the value which is input here.

On the contrary to the automatic setting field 2104 which automatically selects the primary beams for surface charge control based on the condition which has been input, the field for manual setting 2105 is a field for the operator to directly select the primary beams for surface charge control. On selecting the field for manual setting 2105 by the radio button, the current and the interval from the primary beam for inspection are displayed with respect to each of the four primary beams for surface charge control and the operator can determine the irradiation or the no irradiation of each of them by the radio button.

Embodiment 9

Figure 22:
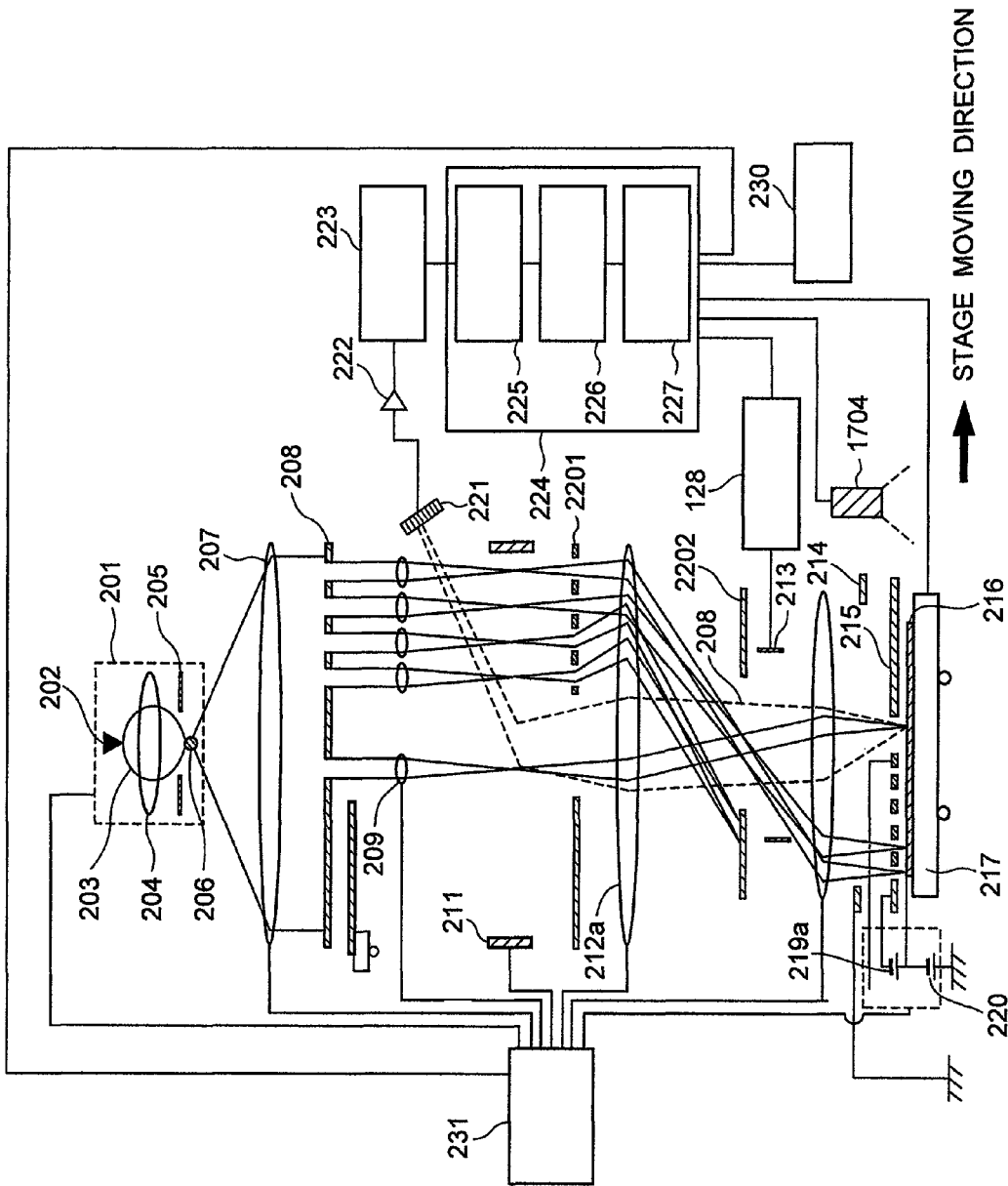
FIG. 22 is a schematic configuration diagram of the electron beam inspection apparatus of a ninth embodiment.

FIG. 22 is a diagram showing another example of the configuration of the electron beam inspection apparatus which has the almost same effect as the embodiment 8. Four primary beams for inspection and 16 primary beams for surface charge control are formed in the same way as FIG. 17. 2201 is a blanker array in which the blankers of electrostatic deflector type which are able to be driven individually are formed in two dimensions on the substrate. It individually controls whether to irradiate the corresponding electron beam on the wafer 216 or not. Namely, the electron beam of which moving direction is bended by the blanker is cut off by a blanking stop 2202 and does not reach onto the wafer 216. On the other hand, the beam which is not deflected by the blanker passes through the aperture of the blanking stop 2202 and reaches onto the wafer 216. As it is possible to select the desired primary beams for surface charge control also when the blanker array is used in this way, it is possible to control the current of the primary beam for surface charge control and the time from when the primary beam for surface charge control is irradiated to when the inspection is conducted by the primary beam for inspection.

Embodiment 10

Figure 23:
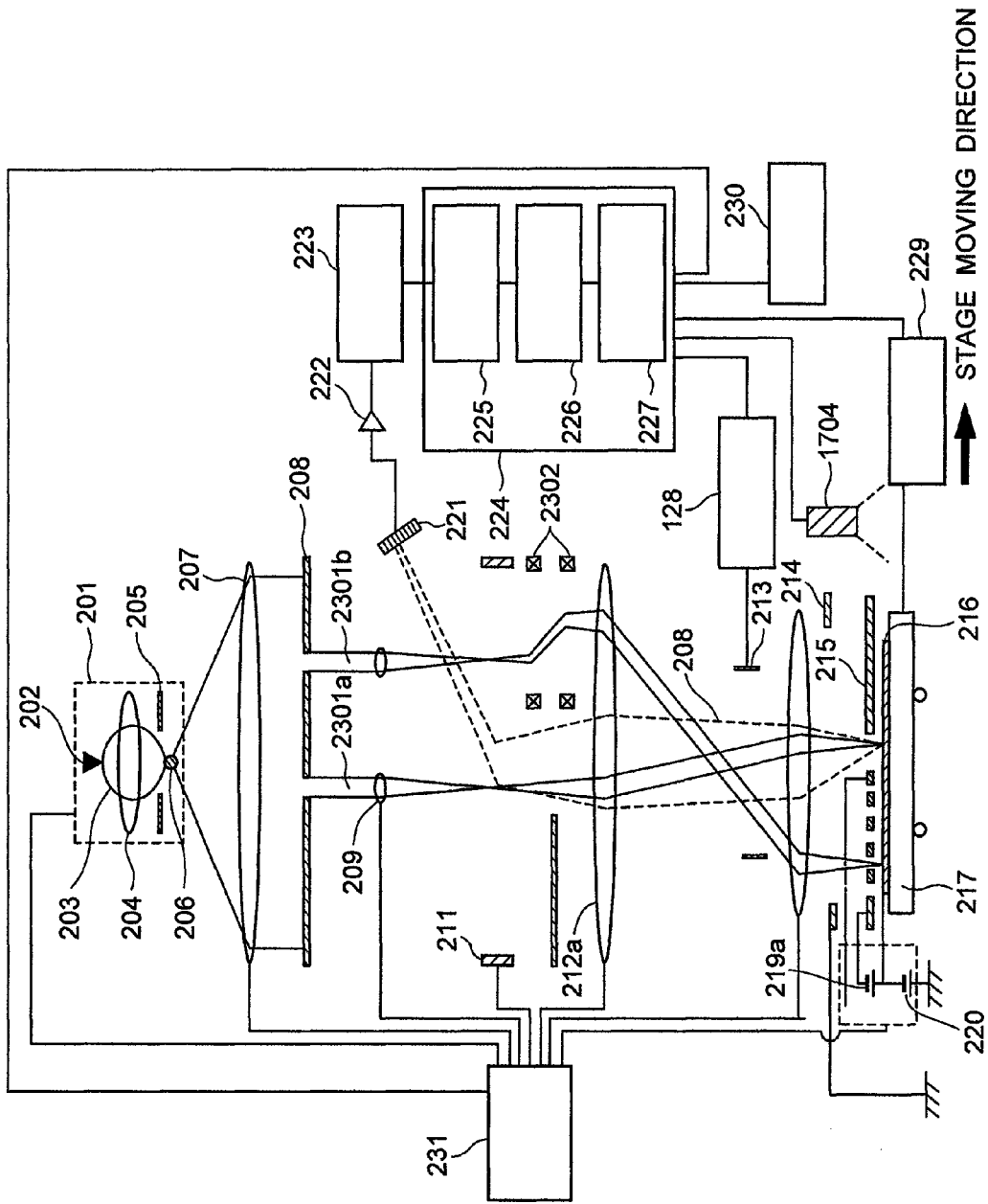
FIG. 23 is a schematic configuration diagram of the electron beam inspection apparatus of a tenth embodiment.

Further, the FIG. 23 is a diagram showing a schematic configuration of an electron beam inspection apparatus in another embodiment in which it is possible to control the current of the primary beam for surface charge control and the time from when the primary beam for surface charge control is irradiated to when the inspection is conducted by the primary beam for inspection. In this embodiment, the time to irradiate the surface charge control beam and the inspection beam is controlled by controlling the irradiation position of the beam for surface charge control to the sample. Four primary beams for inspection and 16(?) primary beams for surface charge control are formed, but here each one of them primary beam for inspection 2301a and primary beam for surface charge control 2301b are shown respectively. 2302 is an aligner and it is to bend the moving direction of the primary beam for surface charge control 2301b. It affects the other primary beams for surface charge control not shown in this diagram in the same way. As the position of the primary beam for surface charge control on the wafer 216 can be adjusted to the desired position by using this aligner, it is possible to control the time from when the primary beam for surface charge control 2301b is irradiated to when the inspection is conducted by the primary beam for inspection 2301a. Thereby it becomes possible to control the surface charged state of the sample at the irradiation of the inspection beam to the optimum.

Embodiment 11

In an embodiment 11, another example of the configuration of the electron beam inspection apparatus using the beam selection mask and the beam selection stage will be explained. This embodiment is the one which has also the surface electric field control electrode which has a plurality of throughholes of different diameters and selects the surface charge control beams to be passed through the desired holes by the beam selection mask and the selection stage. Thereby it becomes possible to adjust the surface charge control more precisely and to realize the surface charge control more precise and closer to the desired surface charged state.

In this embodiment, four primary beams for inspection and eight primary beams for surface charge control are formed by the aperture array and the lens array.

Figure 24:
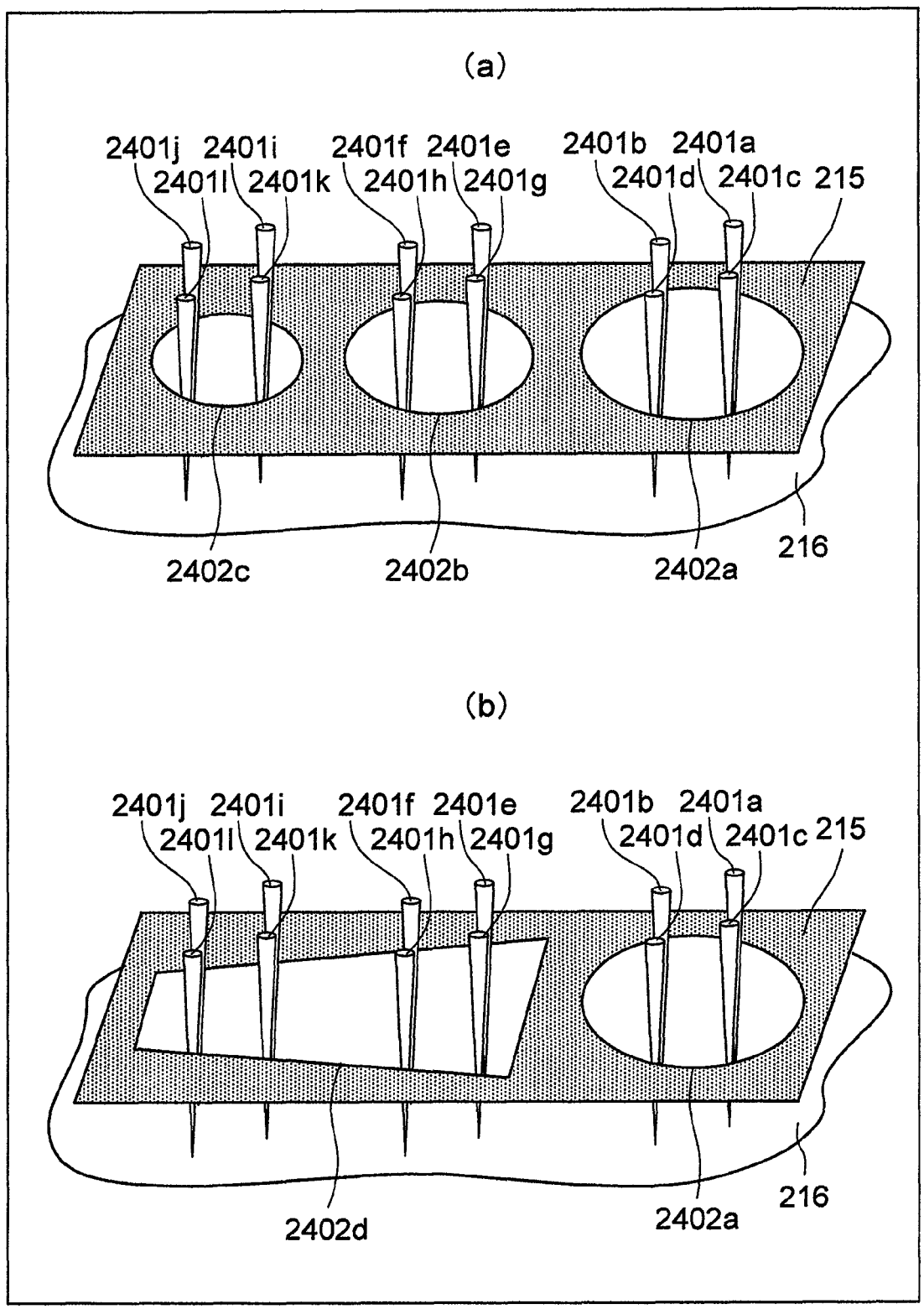
FIG. 24 is an enlarged diagram of a part including the surface electric field control electrode and the wafer of the electron beam inspection apparatus explaining an eleventh embodiment.

FIG. 24(a) is an enlarged diagram of a part including the surface electric field control electrode and the wafer in the electron beam inspection apparatus in the 11th embodiment of the present invention. About the apparatus configuration of the other parts, it is supposed to be the same as the entire configuration diagram of the apparatus shown in FIG. 17.

In the surface electric field control electrode 215 which is installed facing the wafer three throughholes 2402a, 2402b, 2402c are provided. The positions of the throughholes are determined so that the primary beams for inspection 2401a, 2401b, 2401c, 2401d pass through the throughhole 2402a, the beams for surface charge control 2401e, 2401f, 2401g, 2401h pass through the throughhole 2402b, and the primary beams for surface charge control 2401i, 2401j, 2401k, 2401l pass through the throughhole 2402c.

Figure 25:
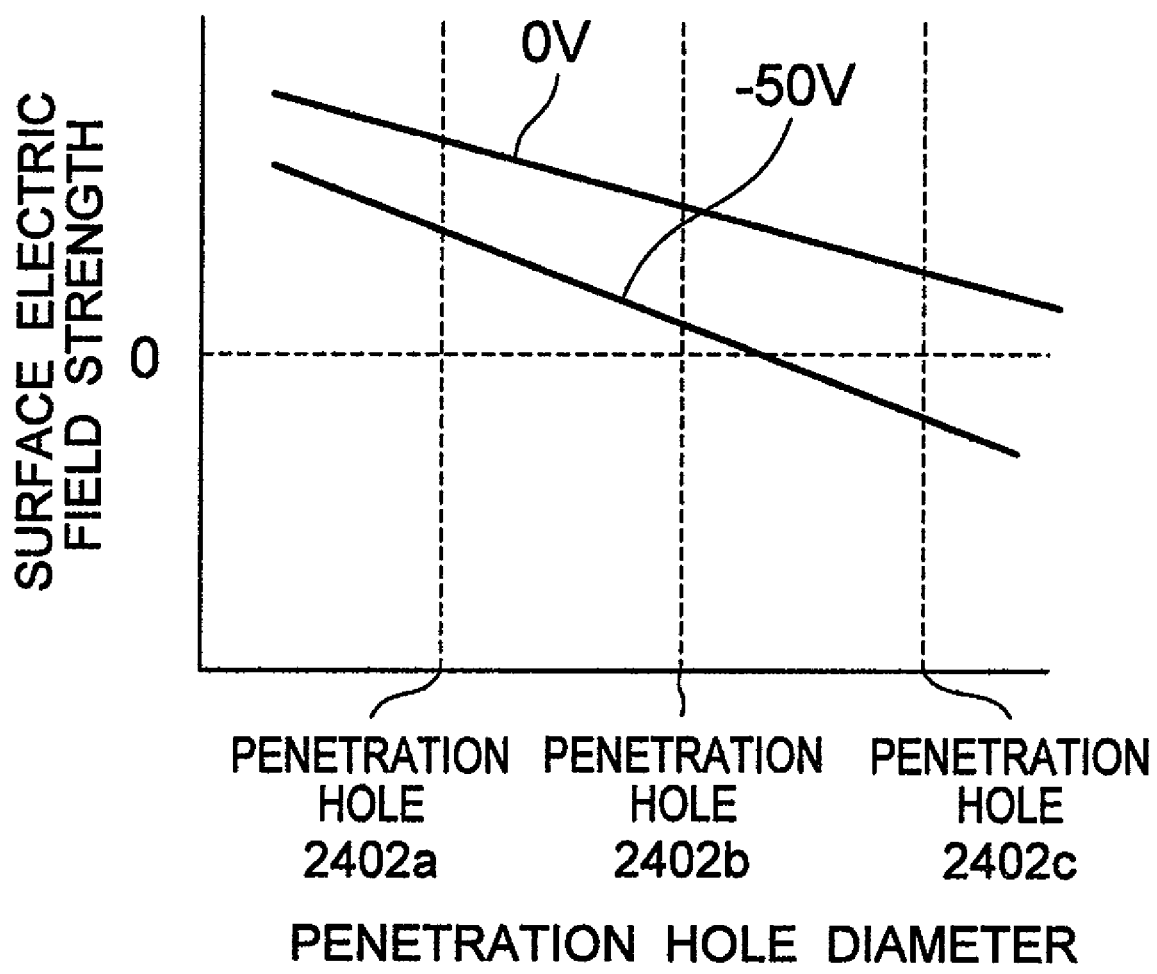
FIG. 25 is a graph showing the relationship between the diameter of the throughhole and the surface electric field strength in the eleventh embodiment.

About the diameters of the throughholes, the throughhole 2402a has the biggest and it becomes smaller in the order of the throughhole 2402b and the throughhole 2402c. FIG. 25 is a graph showing the relationship between the diameter of the throughhole and the surface electric field strength. About the direction of the surface electric field, the upper of the wafer is defined as positive. When the voltage to be applied to the surface electric field control electrode 215 is 0 V, namely when the surface electric field control electrode 215 is at the same potential as the wafer 216, from the voltage relationship between the negative voltage applied to the wafer by the retarding power supply and the ground electrode on the electron gun side compared to the surface electric field control electrode, the surface electric field strength is positive regardless of the diameter of the throughhole. However, it becomes closer to 0 as the diameter of the throughhole becomes smaller. When the voltage to be applied to the surface electric field control electrode 215 is −50 V, as the effect of the surface electric field control electrode 215 becomes greater for the throughhole which has the smaller diameter, the surface electric field strength becomes negative in the area of the throughhole 2402c. Namely, the electric field to pull back the secondary charged particle generated from the sample to the sample is formed. On the other hand, in the area of the throughhole 2402b which has the bigger diameter than the throughhole 2402c, the surface electric field strength is almost 0 and in the area of the throughhole 2402a which has further bigger diameter, the surface electric field strength is positive.

In this embodiment, it is controlled to select the beam which passes through the throughhole which forms the desired surface electrolytic home using the difference of the surface electric field strength by the difference of the diameters of the throughholes. For this reason, the beam selection mask and the beam selection stage which are the same as the embodiment 8 are used. Namely, the control part automatically selects the beam for surface charge control to be passed through the throughhole which realizes the desired surface electric field strength and to be irradiated on the sample and cuts off the unnecessary primary beams for surface charge control for the sample based on the surface electric field strength which the operator has input. This control may be automatically conducted by the control part, or it may have a configuration in which the buttons are displayed so that the operator can select. Thereby the desired surface charge control condition can be formed.

Here, in this embodiment, the two kinds of surface electric field strength are formed by passing the primary beams for surface charge control through the two circular throughholes of different diameters, but as a method to obtain the same effect as this, it is possible to use the fact that the surface electric field strength are different depending on the positions even within a single aperture. Namely, for example as shown in FIG. 24(b), it is possible to form the different surface electric field strength with a single aperture by using a trapezoidal aperture 2402d.

Also, in the case where the selection of the primary beams for surface charge control is not conducted, if a feature in which the surface electric field control electrode can be moved in parallel to the wafer surface, it is possible to form the primary beams for surface charge control which have different surface electric field strength.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An electron beam apparatus comprising an illumination optical system which irradiates an electron beam onto a sample, a detection optical system which detects a group of secondary charged particles generated from irradiation of said electron beam, a sample holder on which the sample is mounted, and a stage which moves said holder, wherein:
    the illumination optical system comprises:
    an illumination system separation unit which separates the electron beam into an electron beam for signal acquisition and an electron beam for surface charge control; and
    a unit to deflect said electron beam for signal acquisition and said electron beam for surface charge control to scan the sample,
    the detection optical system comprises:
    a detection system separation unit which separates a first group of secondary charged particles generated by irradiation of the electron beam for signal acquisition and a second secondary group of charged particles generated by irradiation of the electron beam for surface charge control; and
    a secondary charged particle detector which detects the first secondary charged particle;
    further, comprises a detected signal processing device which processes a signal detected by said secondary charged particle detector.

2. An electron beam apparatus of claim 1, wherein:
    a plurality of electron beams for signal acquisition are formed by the illumination system separation unit,
    the detection system separation unit comprises:
    a unit to separate a plurality of first groups of secondary charged particles generated by the irradiation of said plurality of electron beams for signal acquisition into a number corresponding to the plurality of electron beams for signal acquisition; and
    a secondary charged particle detector which individually detects said plurality of first groups of secondary charged particles.

3. An electron beam apparatus of claim 2, wherein:
    the separation of the first group of secondary charged particles and the second group of secondary charged particles and the separation of the plurality of first secondary charged particles are carried out by the same unit.

4. An electron beam apparatus of claim 1, wherein:
the electron beam for signal acquisition and the electron beam for surface charge control are different from each other at least in one of a height of focus position, a beam diameter on the sample, and a current.

5. An electron beam apparatus of claim 1, further comprises:
an electric field strength control unit which gives different electric field strength to an exposure area of the electron beam for signal acquisition and to an exposure area of the electron beam for surface charge control on the sample.

6. An electron beam apparatus of claim 5, wherein:
the electric field strength control unit comprises:
a surface electric field control electrode which is installed facing the sample and provides at least one throughhole for allowing electron beam pass through, and a power supply which supplies a voltage to said surface electric field control electrode.

7. An electron beam apparatus of claim 5, wherein:
the electric field strength control unit comprises:
a surface electric field control electrode which provides a plurality of sections of the electrode insulated from each other and a throughhole on said plurality of sections of the electrode and is installed facing the sample and a power supply which individually supplies voltage to the plurality of sections of the electrode.

8. An electron beam apparatus of claim 6, wherein:
a first throughhole through which the electron beam for signal acquisition passes and a second throughhole through which the electron beam for surface charge control passes are formed in the surface electric field control electrode, and an diameter of said first throughhole and an diameter of said second throughhole are different.

9. An electron beam apparatus of claim 1, further comprises:
a unit to adjust relative position of an irradiation point of the electron beam for signal acquisition and an irradiation point of the electron beam for surface charge control on the sample to be parallel to a moving direction of the stage.

10. An electron beam apparatus of claim 1, further comprises:
a time interval control unit which changes a time interval between a timing of said electron beam for signal acquisition and a timing of said electron beam for surface charge control in a specified position on said sample.

11. An electron beam apparatus of claim 10, further comprises:
a stage velocity control unit which comprises a function to adjust the time interval.

12. An electron beam apparatus of claim 10, wherein:
the illumination optical system comprises an aligner which adjusts a deflection angle of the electron beam or a convergence lens which converges the electron beam; and
a distance of the electron beam for surface charge control and the electron beam for signal acquisition is controlled by said convergence lens or said aligner.

13. An electron beam apparatus of claim 10, wherein:
the electron beam for surface charge control is split into a plurality of electron beams having a designated distance by the illumination system separation unit; further,
the illumination optical system comprises a function to make only an optional electron beam among said split electron beams for surface charge control reach onto a surface of the sample in order to adjust the time interval.

14. An electron beam apparatus of claim 13, further comprises:
a current adjustment unit which adjusts a current amount of the electron beam for surface charge control.

15. An electron beam apparatus of claim 13, further comprises:
an illumination optical system control unit which selects a number of the electron beams for surface charge control which reach the surface of the sample so that a dosage of the electron beams for surface charge control to the sample is accommodated within an acceptable range.

16. An electron beam apparatus of claim 13, wherein:
the illumination optical system comprises a movable cutoff board which selectively cuts off a part of or all of the split electron beams for surface charge control.

17. An electron beam apparatus of claim 13, wherein:
the illumination optical system comprises a deflection unit and a blanking unit which selectively cut off a part of or all of the plurality of electron beams for surface charge control.

* * * * *